US012796061B2

(12) United States Patent
Shim et al.

(10) Patent No.: US 12,796,061 B2
(45) Date of Patent: Nov. 10, 2026

(54) METHODS OF FABRICATING SEMICONDUCTOR DEVICES

(71) Applicant: Samsung Electronics Co., Ltd., Suwon-si (KR)

(72) Inventors: Gi Woong Shim, Suwon-si (KR); Seong Heum Choi, Suwon-si (KR); Do Sun Lee, Suwon-si (KR); Hyo Seok Choi, Suwon-si (KR); Rak Hwan Kim, Suwon-si (KR); Chung Hwan Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 308 days.

(21) Appl. No.: 18/606,375

(22) Filed: Mar. 15, 2024

(65) Prior Publication Data

US 2025/0072096 A1 Feb. 27, 2025

(30) Foreign Application Priority Data

Aug. 24, 2023 (KR) ........................ 10-2023-0111528

(51) Int. Cl.
*H10D 84/01* (2026.01)
*H10D 84/03* (2025.01)
(Continued)

(52) U.S. Cl.
CPC ....... *H10D 84/013* (2025.01); *H10D 84/0149* (2025.01); *H10D 84/038* (2025.01); *H10P 50/695* (2026.01); *H10W 20/056* (2026.01); *H10W 20/076* (2026.01); *H10D 30/014* (2025.01); *H10D 30/43* (2025.01); *H10D 30/6735* (2025.01); *H10D 30/6757* (2025.01);
(Continued)

(58) Field of Classification Search
None
See application file for complete search history.

(56) References Cited

U.S. PATENT DOCUMENTS

| | | | |
|---|---|---|---|
| 8,357,613 | B2 | 1/2013 | Choi et al. |
| 9,012,321 | B1 | 4/2015 | Kim et al. |

(Continued)

FOREIGN PATENT DOCUMENTS

| | | | |
|---|---|---|---|
| KR | 20030052828 | A | 6/2003 |
| KR | 20030053203 | A | 6/2003 |
| KR | 20060010922 | A | 2/2006 |

*Primary Examiner* — Hung K Vu
(74) *Attorney, Agent, or Firm* — Wolf, Greenfield & Sacks, P.C.

(57) ABSTRACT

A method of fabricating a semiconductor device includes: forming an active pattern on a substrate, forming a source/drain pattern on the active pattern, forming a contact hole on the source/drain pattern, forming a contact barrier layer, which has an upper surface of a first height based on a bottom surface of the contact hole, in the contact hole, forming a passivation layer on the contact barrier layer in the contact hole, forming a mask layer on the passivation layer in the contact hole, removing an upper portion of the contact barrier layer so that an upper surface of the contact barrier layer has a second height lower than the first height, removing the passivation layer and the mask layer, and forming a contact filling layer, which covers the upper surface of the contact barrier layer and fills the contact hole, in the contact hole.

20 Claims, 24 Drawing Sheets

(51) Int. Cl.

| | |
|---|---|
| ***H10P 50/00*** | (2026.01) |
| ***H10W 20/00*** | (2026.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/83* | (2025.01) |

(52) U.S. Cl.
CPC ......... *H10D 62/118* (2025.01); *H10D 64/017* (2025.01); *H10D 84/83* (2025.01)

(56) References Cited

U.S. PATENT DOCUMENTS

| | | | | |
|---|---|---|---|---|
| 9,099,401 | B2 | 8/2015 | He et al. | |
| 10,854,426 | B2 | 12/2020 | Cui et al. | |
| 2006/0113671 | A1 * | 6/2006 | Isa | H10P 14/46 257/E21.585 |
| 2010/0052073 | A1 * | 3/2010 | Taya | H10D 84/0179 257/E27.061 |
| 2014/0084375 | A1 * | 3/2014 | Lee | H10W 20/023 257/621 |

* cited by examiner

METHODS OF FABRICATING SEMICONDUCTOR DEVICES

REFERENCE TO PRIORITY APPLICATION

This application claims priority under 35 U.S.C. 119 to Korean Patent Application No. 10-2023-0111528, filed Aug. 24, 2023, the disclosure of which is hereby incorporated herein by reference.

BACKGROUND

The present disclosure relates to methods of fabricating semiconductor devices.

As one of the scaling techniques for increasing a density of a semiconductor device, a multi-gate transistor, which is fabricated by forming a multi-channel active pattern (or silicon body) of a fin or nanowire shape on a substrate, and forming a gate on a surface of the multi-channel active pattern, has been suggested.

As a pitch size of the semiconductor device is reduced, studies for reducing capacitance and maintaining electrical stability between contacts in the semiconductor device will be required.

SUMMARY

An object of the present disclosure is to provide a method of fabricating a semiconductor device in which reliability of a resulting product is improved.

The objects of the present disclosure are not limited to those mentioned above, and additional objects of the present disclosure, which are not mentioned herein, will be clearly understood by those skilled in the art from the following description of the present disclosure.

According to some aspects of the present disclosure, a method of fabricating a semiconductor device includes: forming an active pattern on a substrate, forming a source/drain pattern on the active pattern, forming a contact hole on the source/drain pattern, forming a contact barrier layer, which has an upper surface of a first height based on a bottom surface of the contact hole, in the contact hole, forming a passivation layer on the contact barrier layer in the contact hole, forming a mask layer on the passivation layer in the contact hole, removing an upper portion of the contact barrier layer so that an upper surface of the contact barrier layer has a second height lower than the first height, removing the passivation layer and the mask layer, and forming a contact filling layer, which covers the upper surface of the contact barrier layer and fills the contact hole, in the contact hole.

According to some additional aspects of the present disclosure, a method of fabricating a semiconductor device includes: forming an active pattern on a substrate, forming a source/drain pattern on the active pattern, forming a contact hole on the source/drain pattern, forming a contact barrier layer, which covers entire sidewalls of the contact hole, in the contact hole, forming a contact liner layer on the contact barrier layer in the contact hole, forming a passivation layer extended along the contact liner layer in the contact hole, forming a mask layer on the passivation layer in the contact hole, exposing a portion of the sidewalls of the contact hole by removing upper portions of the contact barrier layer and the contact liner layer, removing the passivation layer and the mask layer, and forming a contact filling layer on the contact barrier layer and the contact liner layer, in the contact hole. In some embodiments, the contact filling layer extends along a portion of the sidewalls of the contact hole.

According to further aspects of the present disclosure, a method of fabricating a semiconductor device includes: forming an active pattern on a substrate, forming a source/drain pattern on the active pattern, forming a contact hole on the source/drain pattern, forming a contact barrier layer, which has an upper surface of a first height based on a bottom surface of the contact hole, in the contact hole, forming a contact liner layer, which has an upper surface of a second height based on the bottom surface of the contact hole, on the contact barrier layer, forming a passivation layer on the contact liner layer by oxidizing an upper surface of the contact liner layer in the contact hole, forming an impurity layer on the passivation layer in the contact hole, forming a mask layer on the impurity layer, removing an upper portion of the contact barrier layer so that an upper surface of the contact barrier layer has a third height lower than the first height, removing an upper portion of the contact liner layer so that an upper surface of the contact liner layer has a fourth height lower than the second height, removing the passivation layer, the impurity layer and the mask layer, and forming a contact filling layer, which covers the upper surface of the contact barrier layer of the third height and the upper surface of the contact liner layer of the fourth height and fills the contact hole, in the contact hole. In some embodiments, the contact filling layer may include a first portion surrounded by the contact barrier layer and the contact liner layer, and a second portion extending on the first portion and on the upper surface of the contact barrier layer and the upper surface of the contact liner layer. The contact barrier layer may include titanium nitride, and each of the contact liner layer and the contact filling layer may include tungsten. Moreover, an average grain size of the contact liner layer may be 10 nm or less, and an average grain size of the first portion of the contact filling layer and an average grain size of the second portion of the contact filling layer may be 10 nm or more.

DETAILED DESCRIPTION OF EMBODIMENTS

Figure 1:
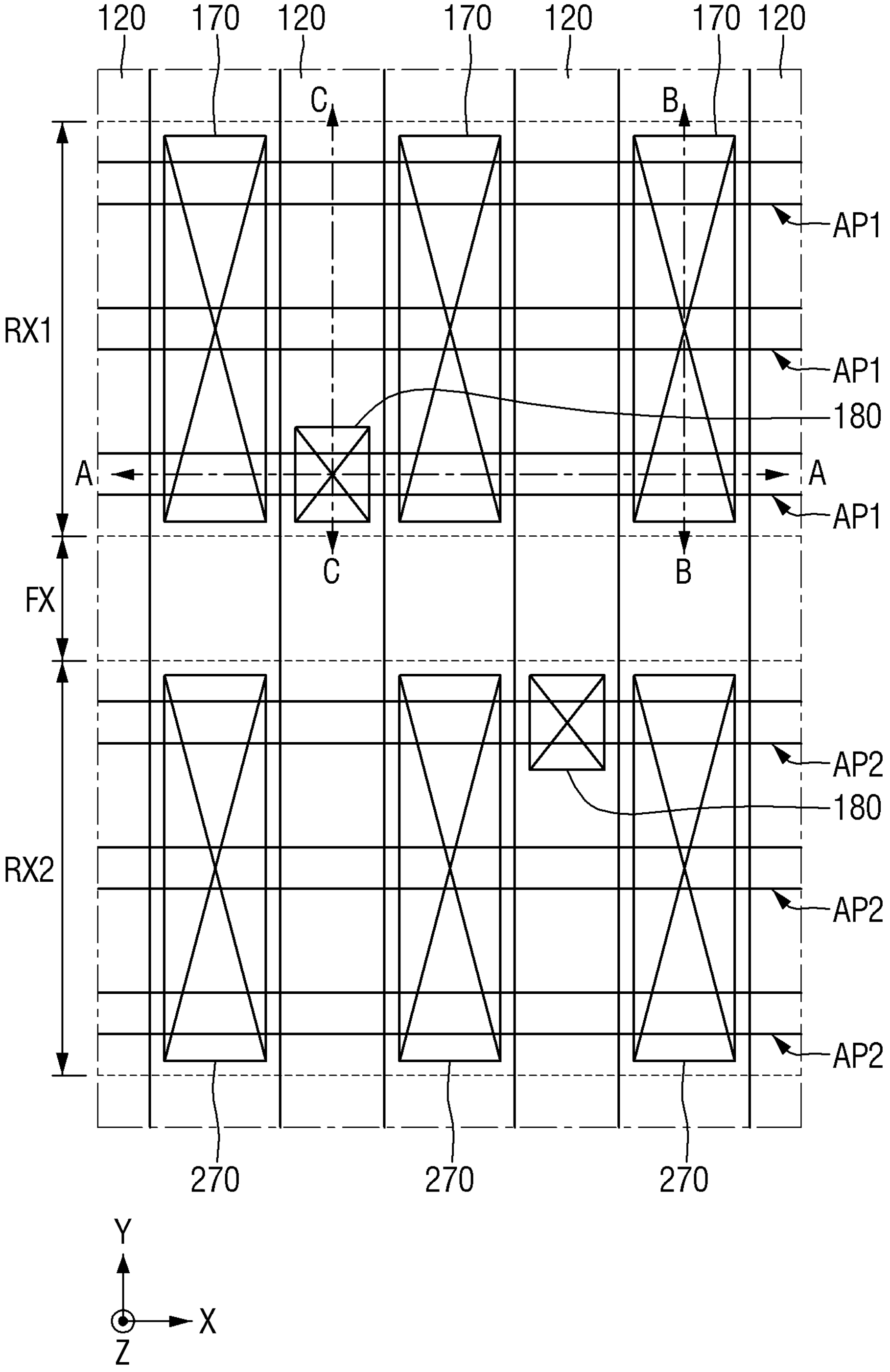
FIG. 1 is an example plan layout view illustrating a semiconductor device according to some embodiments.

Hereinafter, the embodiments according to the technical spirits of the present disclosure will be described with reference to the accompanying drawings.

In the drawings related to a semiconductor device according to some embodiments, a fin-type transistor (FinFET) including a channel region of a fin-type pattern shape, a transistor including a nanowire or a nano sheet, a multi-bridge channel field effect transistor (MBCFET™) or a vertical transistor (vertical FET) is shown by way of example, but the present disclosure is not limited thereto. The semiconductor device according to some embodiments may include a tunneling transistor (tunneling FET) or a three-dimensional (3D) transistor. The semiconductor device according to some embodiments may include a planar transistor. In addition, the technical spirits of the present disclosure may be applied to two-dimensional (2D) material-based transistors (FETs) and a heterogeneous structure thereof. In addition, the semiconductor device according to some embodiments may include a bipolar junction transistor, a laterally diffused metal oxide semiconductor (LDMOS) transistor and the like.

Figure 2:
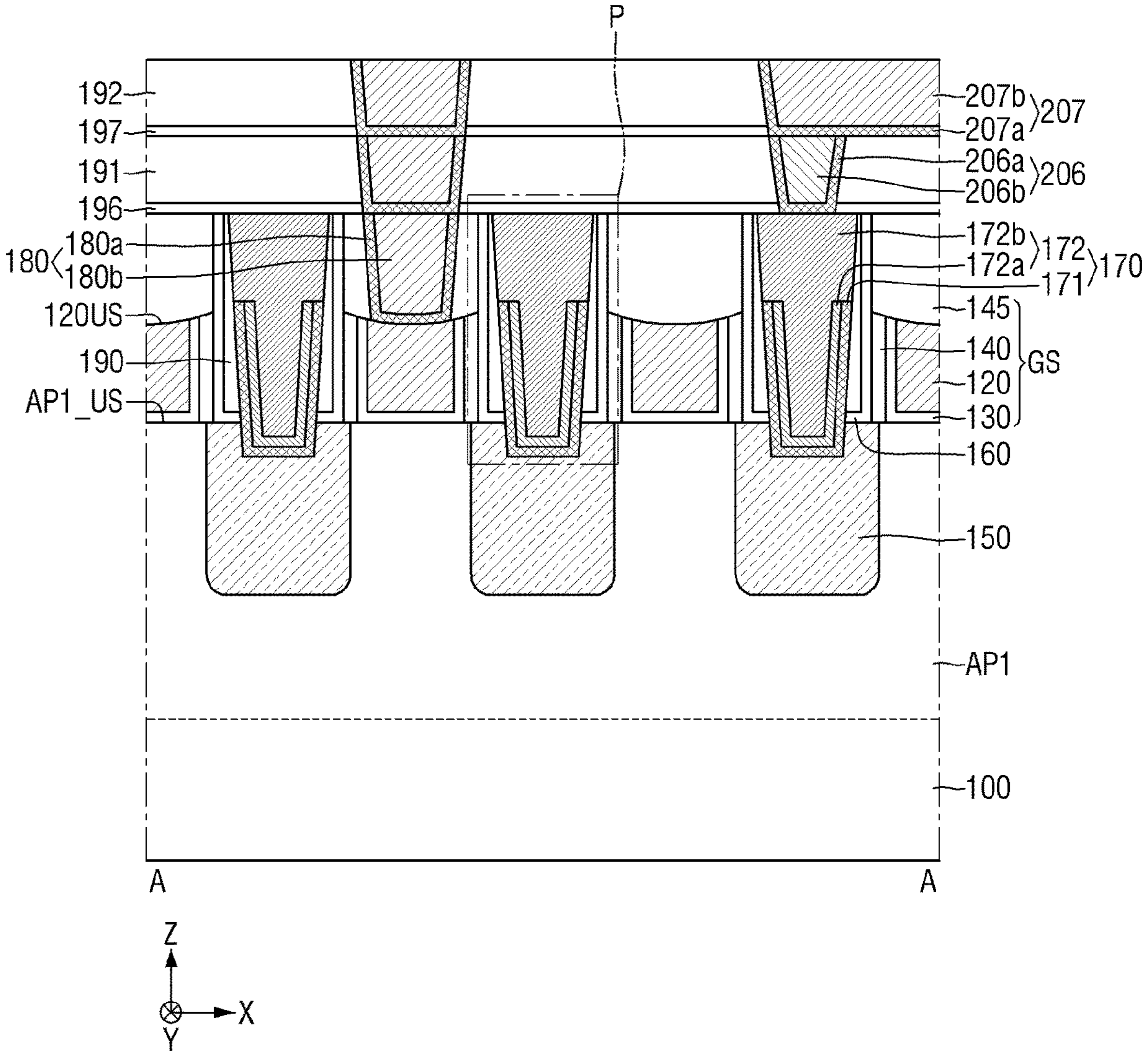
FIG. 2 is an example cross-sectional view taken along line A-A of FIG. 1.
Figure 3:
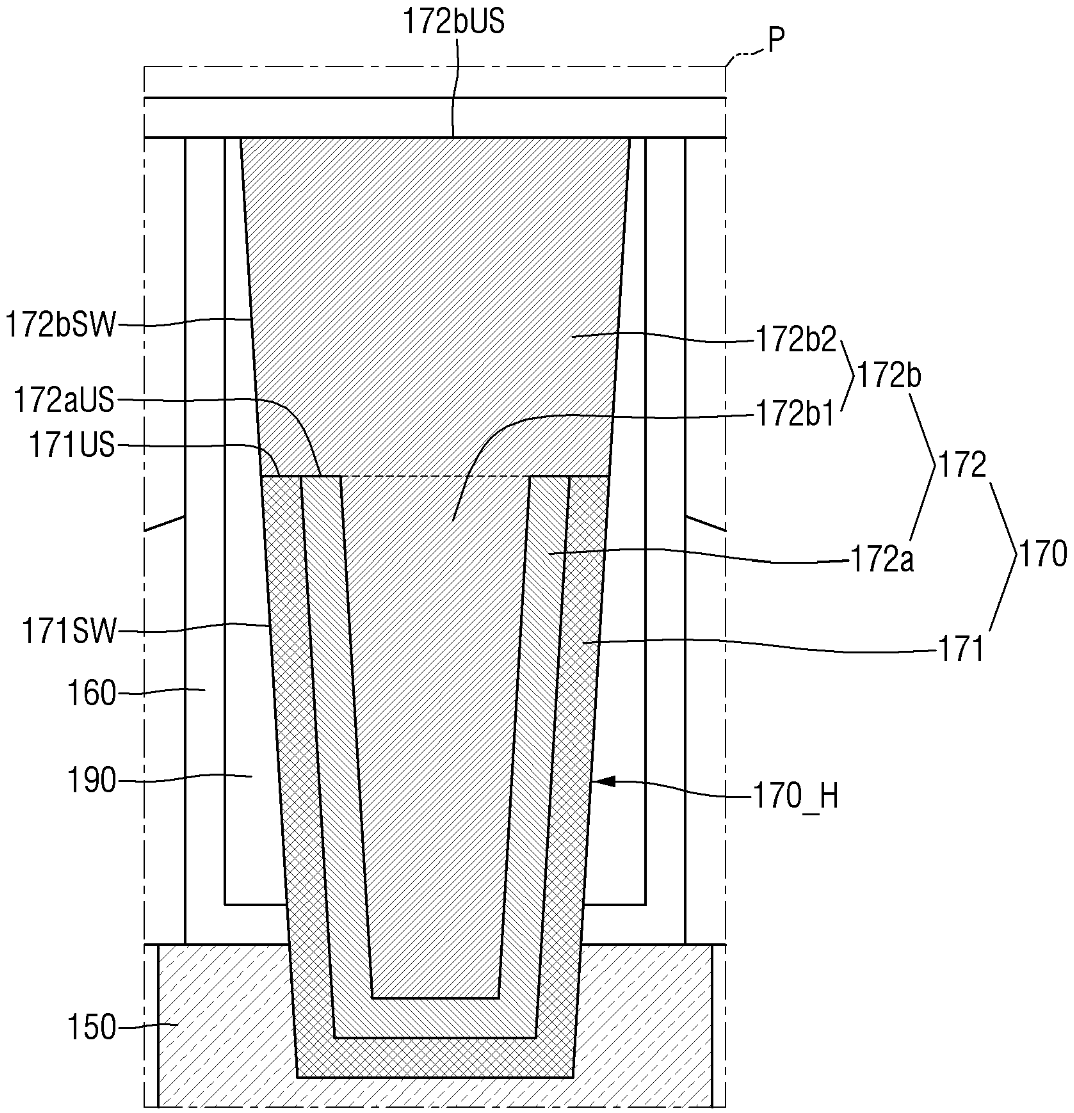
FIG. 3 is an enlarged view illustrating a portion P of FIG. 2.
Figure 4:
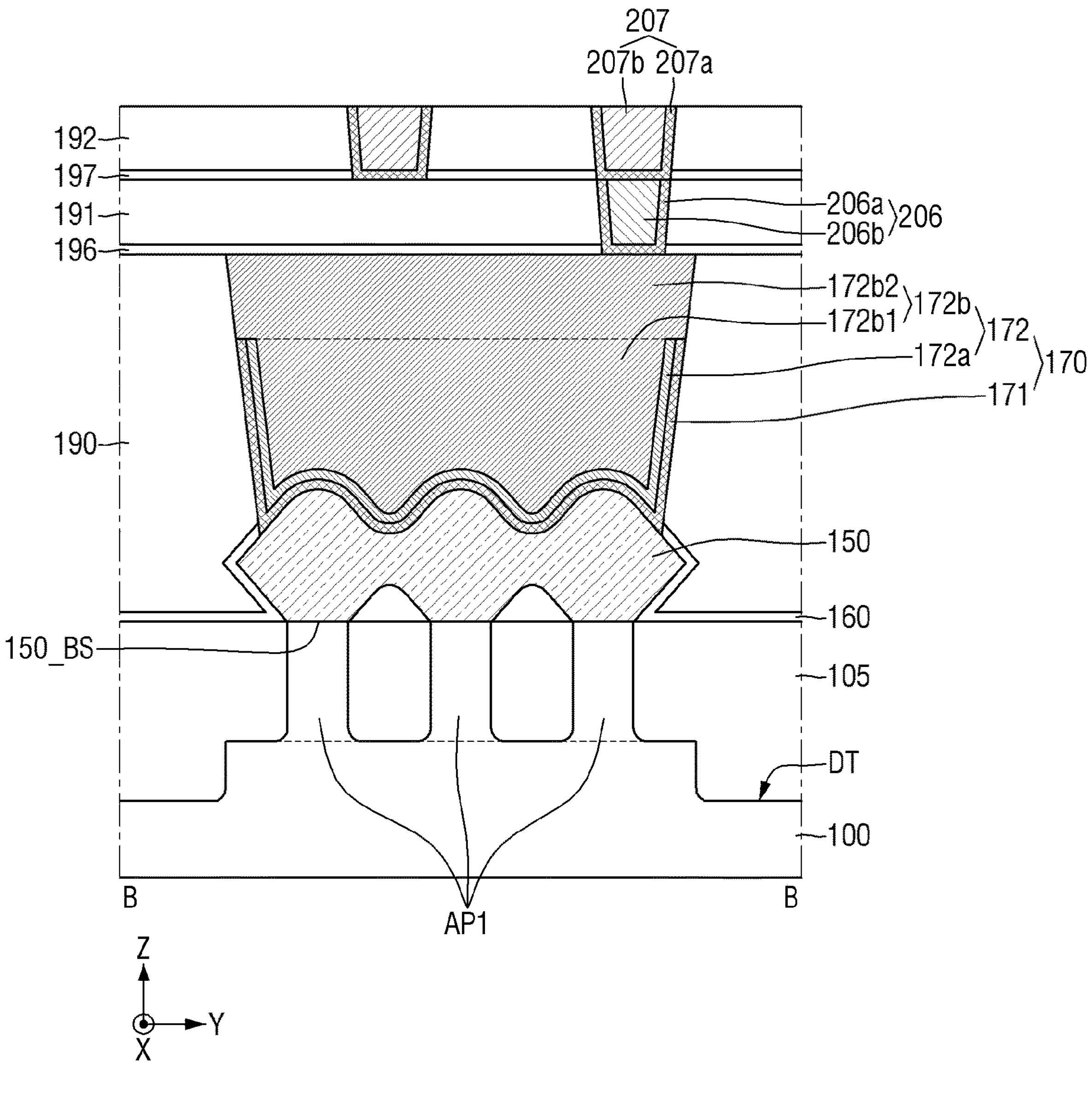
FIG. 4 is an example cross-sectional view taken along line B-B of FIG. 1.
Figure 5:
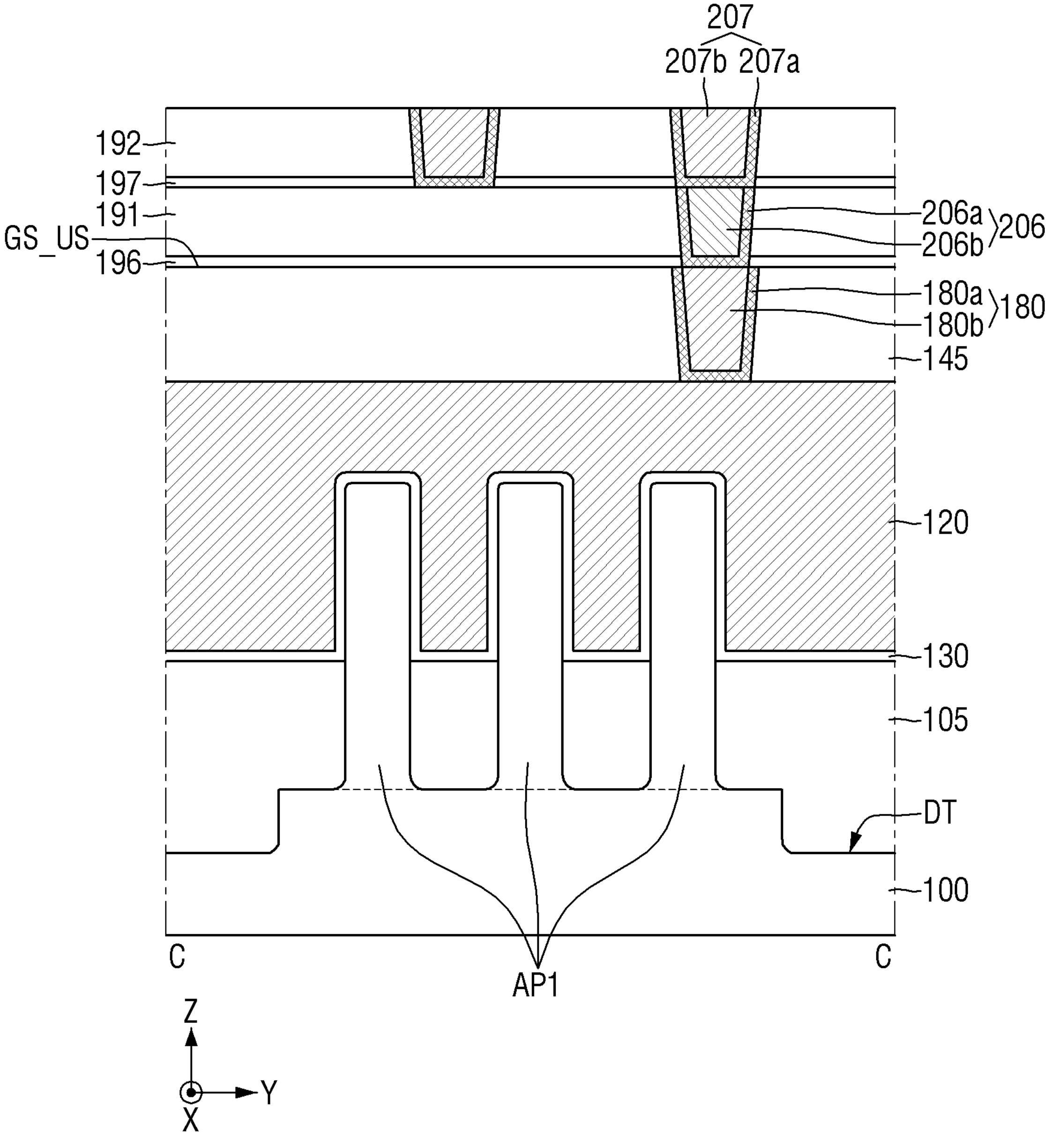
FIG. 5 is an example cross-sectional view taken along line C-C of FIG. 1.

FIG. 1 is an example layout view illustrating a semiconductor device according to some embodiments; FIG. 2 is an example cross-sectional view taken along line A-A of FIG. 1; FIG. 3 is an enlarged view illustrating a portion P of FIG. 2; FIG. 4 is an example cross-sectional view taken along line B-B of FIG. 1; and FIG. 5 is an example cross-sectional view taken along line C-C of FIG. 1. Referring now to FIGS. 1 to 5, a semiconductor device according to some embodiments may include at least one first active pattern AP1, at least one second active pattern AP2, at least one first gate electrode 120, a first source/drain contact 170, a second source/drain contact 270, and a gate contact 180.

A substrate 100 may include a first active region RX1, a second active region RX2 and a field region FX. The field region FX may be formed to be directly adjacent to the first active region RX1 and the second active region RX2. The field region FX may constitute a boundary with the first active region RX1 and the second active region RX2. The first active region RX1 and the second active region RX2 are spaced apart from each other. The first active region RX1 and the second active region RX2 may be separated by the field region FX.

In other words, an element isolation layer may be disposed in the vicinity of the first active region RX1 and the second active region RX2, which are spaced apart from each other. A portion of the element isolation layer, which is between the first active region RX1 and the second active region RX2, may be the field region FX. For example, a portion in which a channel region of a transistor, which may be an example of a semiconductor device, is formed may be an active region, and a portion partitioning the channel region of the transistor formed in the active region may be the field region. Alternatively, the active region may be a portion in which a fin-type pattern or a nano sheet used as the channel region of the transistor is formed, and the field region may be a region in which a fin-type pattern or nano sheet used as the channel region is not formed.

As shown in FIGS. 4 and 5, the field region FX may be defined by a deep trench DT, but is not limited thereto. In addition, it will be apparent that those skilled in the art to which the present disclosure pertains may identify which portion is a field region and which portion is an active region.

For example, one of the first active region RX1 and the second active region RX2 may be a PMOS forming region, and the other one of the first active region RX1 and the second active region RX2 may be an NMOS forming region. For another example, the first active region RX1 and the second active region RX2 may be PMOS forming regions. For other example, the first active region RX1 and the second active region RX2 may be NMOS forming regions.

The substrate 100 may be a silicon substrate or a silicon-on-insulator (SOI). Alternatively, the substrate 100 may include, but is not limited to, silicon germanium, silicon germanium on insulator (SGOI), indium antimonide, lead telluride, indium arsenide, indium phosphide, gallium arsenide or gallium antimonide.

At least one first active pattern AP1 may be formed in the first active region RX1. The first active pattern AP1 may be protruded from the substrate 100 of the first active region RX1. The first active pattern AP1 may be extended lengthwise along a first direction X on the substrate 100. For example, the first active pattern AP1 may include a long side extended in the first direction X and a short side extended in a second direction Y. In this case, the first direction X may cross the second direction Y and a third direction Z. In addition, the second direction Y may cross the third direction Z. The third direction Z may be a thickness direction of the substrate 100.

At least one second active pattern AP2 may be formed in the second active region RX2. A description of the second active pattern AP2 may be substantially the same as that of the first active pattern AP1. Each of the first active pattern AP1 and the second active pattern AP2 may be a multi-channel active pattern. In the semiconductor device according to some embodiments, each of the first active pattern AP1 and the second active pattern AP2 may be, for example, a fin-type pattern. Each of the first active pattern AP1 and the second active pattern AP2 may be used as the channel region of the transistor. Each of the first active pattern AP1 and the second active pattern AP2 is shown as being three, but is not limited thereto. Each of the first active pattern AP1 and the second active pattern AP2 may be one or more.

Each of the first active pattern AP1 and the second active pattern AP2 may be a portion of the substrate 100, or may include an epitaxial layer grown from the substrate 100. The first active pattern AP1 and the second active pattern AP2 may include, for example, silicon or germanium, which is an elemental semiconductor material. In addition, the first active pattern AP1 and the second active pattern AP2 may include a compound semiconductor, and may include, for example, a group IV-IV group compound semiconductor or a group III-V compound semiconductor.

The group IV-IV compound semiconductor may be a binary compound or ternary compound, which includes at least two of carbon (C), silicon (Si), germanium (Ge) or tin (Sn), or a compound including at least two of carbon (C), silicon (Si), germanium (Ge) or tin (Sn), which are doped with a group IV element.

The group III-V compound semiconductor may be, for example, one of a binary compound, a ternary compound or a quaternary compound, which is formed by combination of at least one of aluminum (Al), gallium (Ga) or indium (In), which is a group III element, and one of phosphorus (P), arsenic (As) and antimony (Sb), which are group V elements.

For example, the first active pattern AP1 and the second active pattern AP2 may include the same material. For example, each of the first active pattern AP1 and the second active pattern AP2 may be a silicon fin-type pattern. Alternatively, for example, each of the first active pattern AP1 and the second active pattern AP2 may be a fin-type pattern including a silicon-germanium pattern. For another example, the first active pattern AP1 and the second active pattern AP2 may include their respective materials different from each other. For example, the first active pattern AP1 may be a silicon fin-type pattern, and the second active pattern AP2 may be a fin-type pattern including a silicon-germanium pattern.

A field insulating layer 105 may be formed on the substrate 100. The field insulating layer 105 may be formed over the first active region RX1, the second active region RX2 and the field region FX. The field insulating layer 105 may fill the deep trench DT. In addition, the field insulating layer 105 may cover sidewalls of the first active pattern AP1 and sidewalls of the second active pattern AP2. Each of the first active pattern AP1 and the second active pattern AP2 may be more protruded upward than an upper surface of the field insulating layer 105. The field insulating layer 105 may include, for example, an oxide layer, a nitride layer, an oxynitride layer or their combination layer.

At least one gate structure GS may be disposed on the substrate 100. For example, at least one gate structure GS may be disposed on the field insulating layer 105. The gate structure GS may be extended in the second direction Y. The adjacent gate structures GS may be spaced apart from each other in the first direction X. The gate structure GS may be disposed on the first active pattern AP1 and the second active pattern AP2. The gate structure GS may cross the first active pattern AP1 and the second active pattern AP2.

Although the gate structure GS is shown as being disposed over the first active region RX1 and the second active region RX2, this is only for convenience of description and is not limited thereto. That is, a portion of the gate structures GS may be divided into two portions by a gate isolation structure disposed on the field insulating layer 105, and thus may be disposed on the first active region RX1 and the second active region RX2. The gate structure GS may include, for example, a gate electrode 120, a gate insulating layer 130, a gate spacer 140 and a gate capping layer 145.

The gate electrode 120 may be disposed on the first active pattern AP1 and the second active pattern AP2. The gate electrode 120 may cross the first active pattern AP1 and the second active pattern AP2. The gate electrode 120 may surround the first active pattern AP1 and the second active pattern AP2, which are more protruded than the upper surface of the field insulating layer 105. The gate electrode 120 may include a long side extended in the second direction Y and a short side extended in the first direction X. An upper surface of the gate electrode 120 may be a concave curved surface recessed toward an upper surface of the first active pattern AP1.

The gate electrode 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or their combination. In addition, the gate electrode 120 may include a conductive metal oxide, a conductive metal oxynitride, etc., and may include an oxidized form of the above-described materials.

The gate electrode 120 may be disposed on both sides of a source/drain pattern 150 that will be described later. The gate structure GS may be disposed on both sides of the source/drain pattern 150 in the first direction X. For example, the gate electrode 120 disposed on both sides of the source/drain pattern 150 may be a normal gate electrode used as the gate of the transistor. For another example, the gate electrode 120 disposed on one side of the source/drain pattern 150 is used as the gate of the transistor, but the gate electrode 120 disposed on the other side of the source/drain pattern 150 may be a dummy gate electrode.

The gate spacer 140 may be disposed on sidewalls of the gate electrode 120. The gate spacer 140 may be extended in the second direction Y. The gate spacer 140 may include at least one of, for example, silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC) or their combination.

The gate insulating layer 130 may be extended along sidewalls and a bottom surface of the gate electrode 120. The gate insulating layer 130 may be formed on the first active pattern AP1, the second active pattern AP2 and the field insulating layer 105. The gate insulating layer 130 may be formed between the gate electrode 120 and the gate spacer 140. The gate insulating layer 130 may be formed along a profile of the first active pattern AP1 more protruded upward than the field insulating layer 105, and the upper surface of the field insulating layer 105. Although not shown, the gate insulating layer 130 may be formed along a profile of the second active pattern AP2 more protruded upward than the field insulating layer 105.

The gate insulating layer 130 may include silicon oxide, silicon oxynitride, silicon nitride, or a high dielectric constant material having a dielectric constant higher than that of silicon oxide. The high dielectric constant material may include at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The gate insulating layer 130 is shown as a single layer, but this is for convenience of description and is not limited thereto. The gate insulating layer 130 may include a plurality of layers. For example, the first gate insulating layer 130 may include an interfacial layer disposed between the first active pattern AP1 and the first gate electrode 120 and between the second active pattern AP2 and the gate electrode 120, and a high dielectric constant insulating layer. For example, the interfacial layer may be formed along a profile of the first active pattern AP1 and a profile of the second active pattern AP2, which are more protruded upward than the field insulating layer 105.

The semiconductor device according to some embodiments may include a negative capacitance (NC) FET based on a negative capacitor. For example, the first gate insulating layer 130 may include a ferroelectric material layer having ferroelectric characteristics and a paraelectric material layer having paraelectric characteristics. In some embodiments, this ferroelectric material layer may have a negative capacitance, and the paraelectric material layer may have a positive capacitance. For example, when two or more capacitors are electrically connected in series, and the capacitance of each capacitor has a positive value, the total capacitance is more reduced than the capacitance of each individual capacitor.

On the other hand, when at least one of capacitances of two or more capacitors electrically connected in series has a negative value, the total capacitance may have a positive value and may be greater than an absolute value of each individual capacitance.

When a ferroelectric material layer having a negative capacitance and a paraelectric material layer having a positive capacitance are electrically connected in series, the total capacitance value of the ferroelectric material layer and the paraelectric material layer, which are electrically connected in series, may be increased. Based on the total capacitance value that is increased, a transistor having a ferroelectric material layer may have a subthreshold swing (SS) less than 60 mV/decade at a room temperature.

The ferroelectric material layer may have ferroelectric characteristics. The ferroelectric material layer may include at least one of, for example, hafnium oxide, hafnium zirconium oxide, barium strontium titanium oxide, barium titanium oxide, or lead zirconium titanium oxide. In this case, for example, the hafnium zirconium oxide may be a material doped with zirconium (Zr) in hafnium oxide. For another example, the hafnium zirconium oxide may be a compound of hafnium (Hf) and zirconium (Zr) and oxygen (O).

The ferroelectric material layer may further include a dopant therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A type of the dopant included in the ferroelectric material layer may be varied depending on the ferroelectric material of the ferroelectric material layer.

When the ferroelectric material layer includes hafnium oxide, the dopant included in the ferroelectric material layer may include at least one of gadolinium (Gd), silicon (Si), zirconium (Zr), aluminum (Al), or yttrium (Y). When the dopant is aluminum (Al), the ferroelectric material layer may include aluminum of 3 at % to 8 at % (atomic %). In this case, a ratio of the dopant may be a ratio of aluminum to a sum of hafnium and aluminum. However, when the dopant is silicon (Si), the ferroelectric material layer may include silicon of 2 at % to 10 at %. When the dopant is yttrium (Y), the ferroelectric material layer may include yttrium of 2 at % to 10 at %. When the dopant is gadolinium (Gd), the ferroelectric material layer may include gadolinium of 1 at % to 7 at %. When the dopant is zirconium (Zr), the ferroelectric material layer may include zirconium of 50 at % to 80 at %.

The paraelectric material layer may have paraelectric characteristics. The paraelectric material layer may include at least one of, for example, silicon oxide or metal oxide having a high dielectric constant. The metal oxide included in the paraelectric material layer may include, but is not limited to, at least one of hafnium oxide, zirconium oxide, or aluminum oxide.

The ferroelectric material layer and the paraelectric material layer may include the same material. Although the ferroelectric material layer has ferroelectric characteristics, the paraelectric material layer may not have ferroelectric characteristics. For example, when the ferroelectric material layer and the paraelectric material layer include hafnium oxide, a crystal structure of hafnium oxide included in the ferroelectric material layer is different from that of hafnium oxide included in the paraelectric material layer.

The ferroelectric material layer may have a thickness having ferroelectric characteristics. The thickness of the ferroelectric material layer may be, for example, 0.5 nm to 10 nm, but is not limited thereto. Since a threshold thickness indicating ferroelectric characteristics may be varied depending on each ferroelectric material, the thickness of the ferroelectric material layer may be varied depending on the ferroelectric material.

For example, the gate insulating layer 130 may include one ferroelectric material layer. For another example, the gate insulating layer 130 may include a plurality of ferroelectric material layers spaced apart from each other. The gate insulating layer 130 may have a stacked layer structure in which a plurality of ferroelectric material layers and a plurality of paraelectric material layers are alternately stacked.

The gate capping layer 145 may be disposed on the upper surface of the gate electrode 120 and an upper surface of the gate spacer 140. The gate capping layer 145 may be disposed between source/drain etch stop layers 160. The gate capping layer 145 may not cover an upper surface of the source/drain etch stop layer 160. The gate capping layer 145 may not overlap the source/drain etch stop layer 160 in the third direction Z. Sidewalls of the gate capping layer 145 may be in contact with the source/drain etch stop layer 160.

An upper surface of the gate capping layer 145 may be an upper surface GS_US of the gate structure. A lower surface of the gate capping layer 145 may have a curved surface. The lower surface of the gate capping layer 145 may be convex toward the gate electrode 120. The upper surface 120US of the gate electrode may have a curved surface. The upper surface 120US of the gate electrode may be convex toward the first active pattern AP1.

The gate capping layer 145 may include at least one of, for example, silicon nitride (SiN), silicon oxynitride (SiON), silicon oxide ($SiO_2$), silicon carbonitride (SiCN), silicon oxycarbonitride (SiOCN) or their combination. Unlike the shown example, the gate capping layer 145 may be disposed between the gate spacers 140. The gate capping layer 145 may not overlap the gate spacer 140 in the third direction Z. In this case, the upper surface of the gate capping layer 145 may be disposed on the same plane as the upper surface of the gate spacer 140. In this case, the upper surface GS_US of the gate structure may include the upper surface of the gate capping layer 145 and the upper surface of the gate spacer 140.

The source/drain pattern 150 may be positioned on the substrate 100. The source/drain pattern 150 may be formed on the first active pattern AP1. The source/drain pattern 150 is electrically connected to the first active pattern AP1. A bottom surface 150_BS of the source/drain pattern 150 is in contact with the first active pattern AP1.

The source/drain pattern 150 may be disposed on sides of the gate structure GS. The source/drain pattern 150 may be disposed between the gate structures GS. For example, the source/drain patterns 150 may be disposed on both sides of the gate structure GS. Unlike the shown example, the source/drain pattern 150 may be disposed on one side of the gate structure GS, and may not be disposed on the other side of the gate structure GS.

The source/drain pattern 150 may include an epitaxial pattern. The source/drain pattern 150 may include a semiconductor material. The source/drain pattern 150 may be included in a source/drain of a transistor, which uses the first active pattern AP1 as a channel region. The source/drain pattern 150 may be electrically connected to the channel region of the first active pattern AP1, which is used as a channel. Although the source/drain pattern 150 is shown as that three epitaxial patterns formed on each of the first active patterns AP1 are merged, it is only for convenience of description and is not limited thereto. That is, the epitaxial patterns respectively formed on the first active patterns AP1 may be separated from each other.

For example, an air gap may be disposed in a space between the source/drain patterns 150 merged with the field insulating layer 105. For another example, an insulating material may be filled in the space between the source/drain patterns 150 merged with the field insulating layer 105. Although not shown, the above-described source/drain pattern may be disposed on the second active pattern AP2 between the gate structures GS.

The source/drain etch stop layer 160 may be extended along the upper surface of the field insulating layer 105, the first interlayer insulating layer 190 and a profile of the source/drain pattern 150. The source/drain etch stop layer 160 may be disposed on an upper surface of the source/drain pattern 150 and sidewalls of the source/drain pattern 150. The source/drain etch stop layer 160 may include a material having an etch selectivity with respect to the first interlayer insulating layer 190 that will be described later. The source/drain etch stop layer 160 may include at least one of, for example, silicon nitride (SiN), silicon oxynitride (SiON), silicon oxycarbonitride (SiOCN), silicon boron nitride (SiBN), silicon oxyboron nitride (SiOBN), silicon oxycarbide (SiOC) or their combination.

The first interlayer insulating layer 190 may be disposed on the source/drain etch stop layer 160. The first interlayer insulating layer 190 may be formed on the field insulating layer 105. The first interlayer insulating layer 190 may be disposed on the source/drain pattern 150. The first interlayer insulating layer 190 may be disposed between the source/drain etch stop layer 160 and the source/drain contact 170. The first interlayer insulating layer 190 may not cover the upper surface GS_US of the gate structure. For example, an upper surface of the first interlayer insulating layer 190 may be disposed on the same plane as the upper surface GS_US of the gate structure. The first interlayer insulating layer 190 may include at least one of, for example, silicon oxide, silicon nitride, silicon oxynitride or a low dielectric constant material. The low dielectric constant material may include Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethylCyclo TetraSiloxane (OMCTS), HexaMethylDiSiloxane (HMDS), TriMethylSilyl Borate (TMSB), DiAcetoxyDitertiaryButoxySiloxane (DADBS), TriMethylSilil Phosphate (TMSP), PolyTetraFluoroEthylene (PTFE), Tonen SilaZen (TOSZ), Fluoride Silicate Glass (FSG), polyimide nanofoams such as polypropylene oxide, Carbon Doped silicon Oxide (CDO), Organo Silicate Glass (OSG), SiLK, Amorphous Fluorinated Carbon, silica aerogels, silica xerogels, mesoporous silica or their combination, but is not limited thereto.

The first source/drain contact 170 may be disposed on the first active region RX1. The second source/drain contact 270 may be disposed on the second active region RX2. The first source/drain contact 170 may be electrically connected to the source/drain pattern 150 formed in the first active region RX1. Although not shown, the second source/drain contact 270 may be electrically connected to the source/drain pattern formed in the second active region RX2. Unlike the shown example, a portion of the first source/drain contact 170 may be directly electrically connected to a portion of the second source/drain contact 270. In other words, in the semiconductor device according to some embodiments, at least one source/drain contact may be disposed over the first active region RX1 and the second active region RX2.

Since the second source/drain contact 270 is substantially the same as the first source/drain contact 170, the following description will be based on the first source/drain contact 170 on the first active pattern AP1. The first source/drain contact 170 may be electrically connected to the source/drain pattern 150 by passing through the source/drain etch stop layer 160. The first source/drain contact 170 may be disposed on the source/drain pattern 150. The first source/drain contact 170 may be disposed in the first interlayer insulating layer 190. The first source/drain contact 170 may be surrounded by the first interlayer insulating layer 190.

The first interlayer insulating layer 190 does not cover an upper surface of the first source/drain contact 170. The upper surface of the first source/drain contact 170 may not be more protruded upward than the upper surface GS_US of the gate structure. The upper surface of the first source/drain contact 170 may be disposed on the same plane as the upper surface GS_US of the gate structure. The upper surface of the first source/drain contact 170 may be more protruded upward than the upper surface GS_US of the gate structure.

The first source/drain contact 170 may include a source/drain contact barrier layer 171 and a source/drain contact filling layer 172 on the source/drain contact barrier layer 171. The source/drain contact filling layer 172 may include an intermediate liner layer **172*a* and an upper filling layer 172*b*. The upper filling layer 172*b* may include a first portion 172*b*1 and a second portion 172*b*2**.

The first source/drain contact 170 may be disposed in a source/drain contact hole 170_H. The first source/drain contact 170 may fill the source/drain contact hole 170_H. The source/drain contact hole 170_H may pass through the first interlayer insulating layer 190. The source/drain contact hole 170_H may expose the source/drain pattern 150.

The source/drain contact barrier layer 171 may be extended along sidewalls and a bottom surface of the source/drain contact filling layer 172. The source/drain contact barrier layer 171 may be extended along a bottom surface and inner sidewalls of the source/drain contact hole 170_H. The source/drain contact barrier layer 171 may not cover the entire inner sidewalls of the source/drain contact hole 170_H. The source/drain contact barrier layer 171 may cover only a portion of the inner sidewalls of the source/drain contact hole 170_H. The source/drain contact barrier layer 171 may be extended along only a portion of the inner sidewalls of the source/drain contact hole 170_H.

The source/drain contact barrier layer 171 may be disposed on the source/drain pattern 150. The source/drain contact barrier layer 171 may be disposed between the source/drain pattern 150 and the source/drain contact filling layer 172. The source/drain contact filling layer 172 may not be in contact with the source/drain pattern 150. The source/drain contact filling layer 172 may be spaced apart from the source/drain pattern 150 with the source/drain contact barrier layer 171 interposed therebetween.

The source/drain contact barrier layer 171 may surround a portion of the source/drain contact filling layer 172. For example, the source/drain contact barrier layer 171 may surround only the intermediate liner layer **172*a* of the source/drain contact filling layer 172. The source/drain contact barrier layer 171 may be extended along sidewalls and a bottom surface of the intermediate liner layer 172*a*. The source/drain contact barrier layer 171 may be in contact with the sidewalls of the intermediate liner layer 172*a*. The source/drain contact barrier layer 171 may overlap the intermediate liner layer 172*a* in the first direction X and the second direction Y. The source/drain contact barrier layer 171 may overlap the intermediate liner layer 172***a* in a horizontal direction.

The source/drain contact barrier layer 171 may surround a portion of the upper filling layer 172*b* of the source/drain contact filling layer 172. The source/drain contact barrier layer 171 may surround the first portion 172*b*1 of the upper filling layer 172*b*. The source/drain contact barrier layer 171 may not be directly in contact with the first portion 172*b*1 of the upper filling layer 172*b*. The source/drain contact barrier layer 171 and the first portion 172*b*1 of the upper filling layer 172*b* may be spaced apart from each other with the intermediate liner layer 172*a* interposed therebetween. The source/drain contact barrier layer 171 may overlap the first portion 172*b*1 of the upper filling layer 172*b* in the first direction X and the second direction Y. The source/drain contact barrier layer 171 may overlap the first portion 172*b*1 of the upper filling layer 172*b* in the horizontal direction.

The source/drain contact barrier layer 171 may not surround the second portion 172*b*2 of the upper filling layer 172*b*. The source/drain contact barrier layer 171 may not overlap the second portion 172*b*2 of the upper filling layer 172*b* in the first direction X and the second direction Y. The source/drain contact barrier layer 171 may not overlap the second portion 172*b*2 of the upper filling layer 172*b* in the horizontal direction. The source/drain contact barrier layer 171 may not be disposed on sidewalls of the second portion 172*b*2 of the upper filling layer 172*b*. The source/drain contact barrier layer 171 may have a U-shape. The source/drain contact barrier layer 171 may surround an entire lower surface of the source/drain contact filling layer 172.

An upper surface 171US of the source/drain contact barrier layer may be disposed on the same plane as an upper surface 172*a*US of the intermediate liner layer. For example, based on a lower surface of the source/drain contact barrier layer 171, a height of the upper surface 171US of the source/drain contact barrier layer may be the same as a height of the upper surface 172*a*US of the intermediate liner layer. That is, based on the bottom surface of the source/drain contact hole 170_H, the height of the upper surface 171US of the source/drain contact barrier layer and the height of the upper surface 172*a*US of the intermediate liner layer may be the same as each other. The upper surface 171US of the source/drain contact barrier layer may be covered by the upper filling layer 172*b*.

The intermediate liner layer 172*a* of the source/drain contact filling layer 172 may be disposed between the source/drain contact barrier layer 171 and the upper filling layer 172*b*. The intermediate liner layer 172*a* may be disposed on the source/drain contact barrier layer 171. The intermediate liner layer 172*a* may be extended along inner sides and a bottom surface of the source/drain contact barrier layer 171.

The intermediate liner layer 172*a* may be disposed below the upper filling layer 172*b*. The intermediate liner layer 172*a* may surround the first portion 172*b*1 of the upper filling layer 172*b*. The intermediate liner layer 172*a* may be extended along a lower surface and sides of the first portion 172*b*1 of the upper filling layer 172*b*. The intermediate liner layer 172*a* may overlap the first portion 172*b*1 of the upper filling layer 172*b* in the first direction X and the second direction Y. The intermediate liner layer 172*a* may overlap the first portion 172*b*1 of the upper filling layer 172*b* in the horizontal direction.

The intermediate liner layer 172*a* may be disposed below the second portion 172*b*2 of the upper filling layer 172*b*. The intermediate liner layer 172*a* may not surround the second portion 172*b*2 of the upper filling layer 172*b*. The intermediate liner layer 172*a* may not overlap the second portion 172*b*2 of the upper filling layer 172*b* in the first direction X and the second direction Y. The intermediate liner layer 172*a* may not overlap the second portion 172*b*2 of the upper filling layer 172*b* in the horizontal direction. The intermediate liner layer 172*a* may overlap the second portion 172*b*2 of the upper filling layer 172*b* in the third direction Z. The intermediate liner layer 172*a* may overlap the second portion 172*b*2 of the upper filling layer 172*b* in a vertical direction. The upper surface 172*a*US of the intermediate liner layer may be covered by the second portion 172*b*2 of the upper filling layer 172*b*. The intermediate liner layer 172*a* may have a U-shape. The intermediate liner layer 172*a* may surround a lower surface and sides of the first portion 172*b*1 of the upper filling layer 172*b*.

The upper filling layer 172*b* of the source/drain contact filling layer 172 may include a first portion 172*b*1 and a second portion 172*b*2. The second portion 172*b*2 may be disposed on the first portion 172*b*1. The second portion 172*b*2 may cover the first portion 172*b*1. The first portion 172*b*1 may completely overlap the second portion 172*b*2 in the third direction Z.

The first portion 172*b*1 may be surrounded by the source/drain contact barrier layer 171 and the intermediate liner layer 172*a*. Sidewalls and a lower surface of the first portion 172*b*1 may be surrounded by the source/drain contact barrier layer 171 and the intermediate liner layer 172*a*. The sidewalls and the lower surface of the first portion 172*b*1 may be directly in contact with the intermediate liner layer 172*a*. The sidewalls and the lower surface of the first portion 172*b*1 may be covered by the intermediate liner layer 172*a*. The first portion 172*b*1 may overlap the source/drain contact barrier layer 171 and the intermediate liner layer 172*a* in the first direction X and the second direction Y. The first portion 172*b*1 may overlap the source/drain contact barrier layer 171 and the intermediate liner layer 172*a* in the horizontal direction.

The second portion 172*b*2 may not be surrounded by the source/drain contact barrier layer 171 and the intermediate liner layer 172*a*. The second portion 172*b*2 may be disposed on the source/drain contact barrier layer 171 and the intermediate liner layer 172*a*. The second portion 172*b*2 may cover the upper surface 171US of the source/drain contact barrier layer and the upper surface 172*a*US of the intermediate liner layer. The second portion 172*b*2 may not overlap the source/drain contact barrier layer 171 and the intermediate liner layer 172*a* in the first direction X and the second direction Y. The second portion 172*b*2 may not overlap the source/drain contact barrier layer 171 and the intermediate liner layer 172*a* in the horizontal direction. The second portion 172*b*2 may overlap the source/drain contact barrier layer 171 and the intermediate liner layer 172*a* in the third direction Z. The second portion 172*b*2 may overlap the source/drain contact barrier layer 171 and the intermediate liner layer 172*a* in the vertical direction.

An average grain size of the first portion 172*b*1 may be the same as that of the second portion 172*b*2. For example, the average grain size of the first portion 172*b*1 of the upper filling layer 172*b* of the source/drain contact filling layer 172, which overlaps the source/drain contact barrier layer 171 containing titanium nitride in the horizontal direction, may be the same as that of the second portion 172*b*2 of the upper filling layer 172*b* of the source/drain contact filling layer 172 that does not overlap the source/drain contact barrier layer 171 in the horizontal direction, but the embodiments are not limited thereto. For example, the average grain size of the second portion **172*b*2 of the upper filling layer 172*b* may be larger than that of the first portion 172*b*1 of the upper filling layer 172*b***.

The average grain size of the first portion **172*b*1 of the upper filling layer 172*b* and the average grain size of the second portion 172*b*2 of the upper filling layer 172*b* may be larger than that of the intermediate liner layer 172*a*. For example, the average grain size of the first portion 172*b*1 of the upper filling layer 172*b* and the average grain size of the second portion 172*b*2 of the upper filling layer 172*b* may be 10 nm or more. The average grain size of the intermediate liner layer 172*a*** may be 10 nm or less.

Outer sidewalls of the source/drain contact filling layer 172 and outer sidewalls 171SW of the source/drain contact barrier layer may be disposed on the same plane. In detail, sidewalls **172*b*SW of the upper filling layer of the source/drain contact filling layer 172 and the outer sidewalls 171**SW of the source/drain contact barrier layer may be disposed on the same plane.

The source/drain contact filling layer 172 may not be in contact with the sidewalls of the source/drain contact barrier layer 171. For example, since the source/drain contact filling layer 172 is spaced apart from the source/drain contact barrier layer 171 by the intermediate liner layer **172*a*, the source/drain contact filling layer 172 may not be in contact with the inner sidewalls of the source/drain contact barrier layer 171. Since the source/drain contact filling layer 172 is disposed on the source/drain contact barrier layer 171, the source/drain contact filling layer 172 may not be in contact with the outer sidewalls of the source/drain contact barrier layer 171**.

The upper surface 171US of the source/drain contact barrier layer may be disposed below the upper surface of the source/drain contact filling layer 172 based on an upper surface AP1_US of the active pattern. The upper surface of the source/drain contact filling layer 172 may be the upper surface **172*b*US of the upper filling layer. The upper surface 171US of the source/drain contact barrier layer may be disposed below the upper surface 172*b*US of the upper filling layer based on the upper surface AP1_US of the active pattern. The upper surface 171US of the source/drain contact barrier layer may be disposed below the upper surface 120US of the gate electrode based on the upper surface AP1**_US of the active pattern.

The first portion **172*b*1 of the upper filling layer 172*b* of the source/drain contact filling layer 172 may not be in contact with the first interlayer insulating layer 190. The first portion 172*b*1 of the upper filling layer 172*b* may not be in contact with the first interlayer insulating layer 190 by being surrounded by the source/drain contact barrier layer 171 and the intermediate liner layer 172*a*. The second portion 172*b*2 of the upper filling layer 172*b* of the source/drain contact filling layer 172 may be in contact with the first interlayer insulating layer 190**.

A bottom surface of the source/drain contact 170 may have a wavy shape along the sidewalls of the source/drain pattern 150, but the embodiments are not limited thereto. Unlike the shown example, the bottom surface of the source/drain contact 170 may have a flat shape.

The source/drain contact barrier layer 171 may include at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) or a two-dimensional (2D) material. In the semiconductor device according to some embodiments, the two-dimensional material may be a metallic material and/or a semiconductor material. The two-dimensional material may include a two-dimensional allotrope or a two-dimensional compound, and may include at least one of, for example, graphene, molybdenum disulfide ($MoS_2$), molybdenum diselenide ($MoSe_2$), tungsten diselenide ($WSe_2$) or tungsten disulfide ($WS_2$), but is not limited thereto. That is, since the two-dimensional materials are only listed by way of example, the two-dimensional material that may be included in the semiconductor device of the present disclosure is not limited by the above-described materials. For example, the source/drain contact barrier layer 171 may include titanium nitride (TiN).

The source/drain contact filling layer 172 may include at least one of, for example, aluminum (Al), tungsten (W), cobalt (Co), ruthenium (Ru), silver (Ag), gold (Au), manganese (Mn) or molybdenum (Mo). For example, each of the intermediate liner layer **172*a* and the upper filling layer 172*b* of the source/drain contact filling layer 172** may include tungsten (W).

The gate contact 180 may be disposed on the gate structure GS. The gate contact 180 may be electrically connected to the gate electrode 120 included in the gate structure GS. The gate contact 180 may be disposed at a position that overlaps the gate structure GS. In the semiconductor device according to some embodiments, at least a portion of the gate contact 180 may be disposed at a position that overlaps at least one of the first active region RX1 or the second active region RX2. For example, in a plan view, the gate contact 180 may be disposed at a position that overlaps the first active region RX1 or the second active region RX2.

The gate contact 180 may include a gate barrier layer **180*a* and a gate filling layer 180*b* on the gate barrier layer 180*a*. The material included in the gate barrier layer 180*a* and the gate filling layer 180*b* may be the same as the description of the source/drain barrier layer 171 and the source/drain filling layer 172. The gate contact 180 may be disposed on the gate electrode 120. The gate contact 180 may be electrically connected to the gate electrode 120 by passing through the gate capping layer 145**.

A first etch stop layer 196 may be disposed on the first interlayer insulating layer 190, the gate structure GS, the source/drain contact 170 and the gate contact 180. A second interlayer insulating layer 191 may be disposed on the first etch stop layer 196. The first etch stop layer 196 may include a material having an etch selectivity with respect to the second interlayer insulating layer 191. For example, the first etch stop layer 196 may include at least one of, for example, silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN), aluminum oxycarbide (AlOC) or their combination. The first etch stop layer 196 is shown as a single layer, but is not limited thereto. Unlike the shown example, the first etch stop layer 196 may not be formed. The second interlayer insulating layer 191 may include at least one of, for example, silicon oxide, silicon nitride, silicon carbonitride, silicon oxynitride or a low dielectric constant material.

A via plug 206 may be disposed in the second interlayer insulating layer 191. The via plug 206 may be directly electrically connected to the first source/drain contact 170 and the gate contact 180 by passing through the first etch stop layer 196. The via plug 206 may include a via barrier layer **206*a* and a via filling layer 206*b***. The via barrier layer 206*a* may be extended along sidewalls and a bottom surface of the via filling layer 206*b*. The via barrier layer 206*a* may include at least one of, for example, tantalum (Ta), tantalum nitride (TaN), titanium (Ti), titanium nitride (TiN), titanium silicon nitride (TiSiN), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) or a two-dimensional (2D) material. The via filling layer 206*b* may include at least one of aluminum (Al), tungsten (W), cobalt (Co), ruthenium (Ru), copper (Cu), silver (Ag), gold (Au), manganese (Mn) or molybdenum (Mo).

A second etch stop layer 197 may be disposed between the second interlayer insulating layer 191 and a third interlayer insulating layer 192. The second etch stop layer 197 may be extended along an upper surface of the second interlayer insulating layer 191. The second etch stop layer 197 may include a material having an etch selectivity with respect to the third interlayer insulating layer 192. The material included in the second etch stop layer 197 may be the same as the description of the first etch stop layer 196. The second etch stop layer 197 is shown as a single layer, but is not limited thereto. Unlike the shown example, the upper etch stop layer 196 may not be formed. The third interlayer insulating layer 192 may include at least one of, for example, silicon oxide, silicon nitride, silicon carbonitride, silicon oxynitride or a low dielectric constant material.

A wiring line 207 may be disposed in the third interlayer insulating layer 192. The wiring line 207 is electrically connected to the via plug 206. The wiring line 207 may be in contact with the via plug 206. The wiring line 207 may include a wiring barrier layer 207*a* and a wiring filling layer 207*b*. The wiring barrier layer 207*a* may include at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), zirconium nitride (ZrN), vanadium (V), vanadium nitride (VN), niobium (Nb), niobium nitride (NbN), platinum (Pt), iridium (Ir), rhodium (Rh) or a 2D material. The wiring filling layer 207*b* may include at least one of aluminum (Al), copper (Cu), tungsten (W), cobalt (Co), ruthenium (Ru), silver (Ag), gold (Au), manganese (Mn) or molybdenum (Mo).

Unlike the shown example, the wiring barrier layer 207*a* may not be disposed between the via filling layer 206*b* and the wiring filling layer 207*b*. Although not shown, a first connection contact connecting the via plug 206 with the first source/drain contact 170 may be further disposed between the via plug 206 and the first source/drain contact 170. Further, a second connection contact connecting the via plug 206 with the gate contact 180 may be further disposed between the via plug 206 and the gate contact 180.

Figure 6:
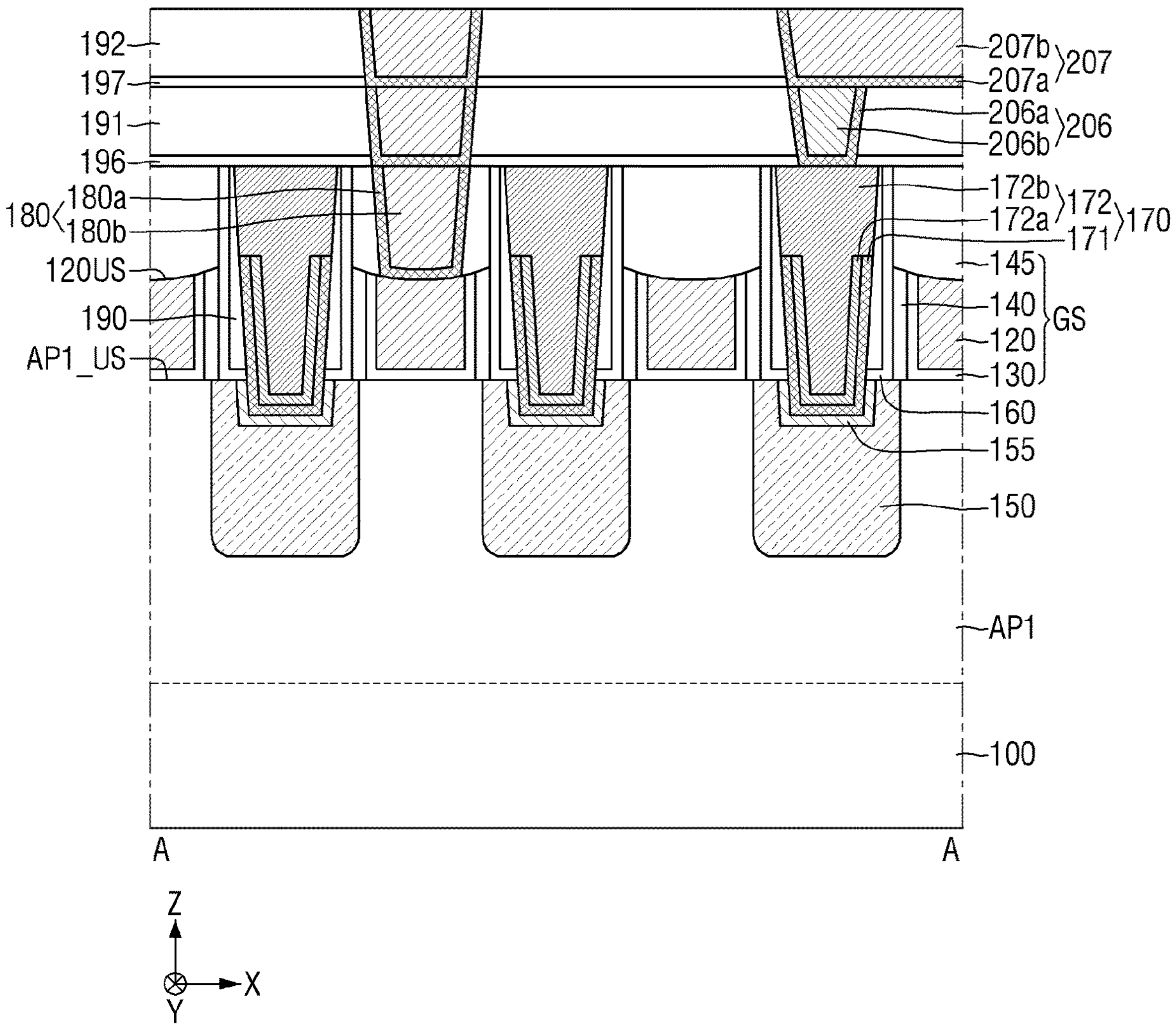
FIGS. 6 and 7 are example cross-sectional views illustrating a semiconductor device according to some other embodiments.
Figure 7:
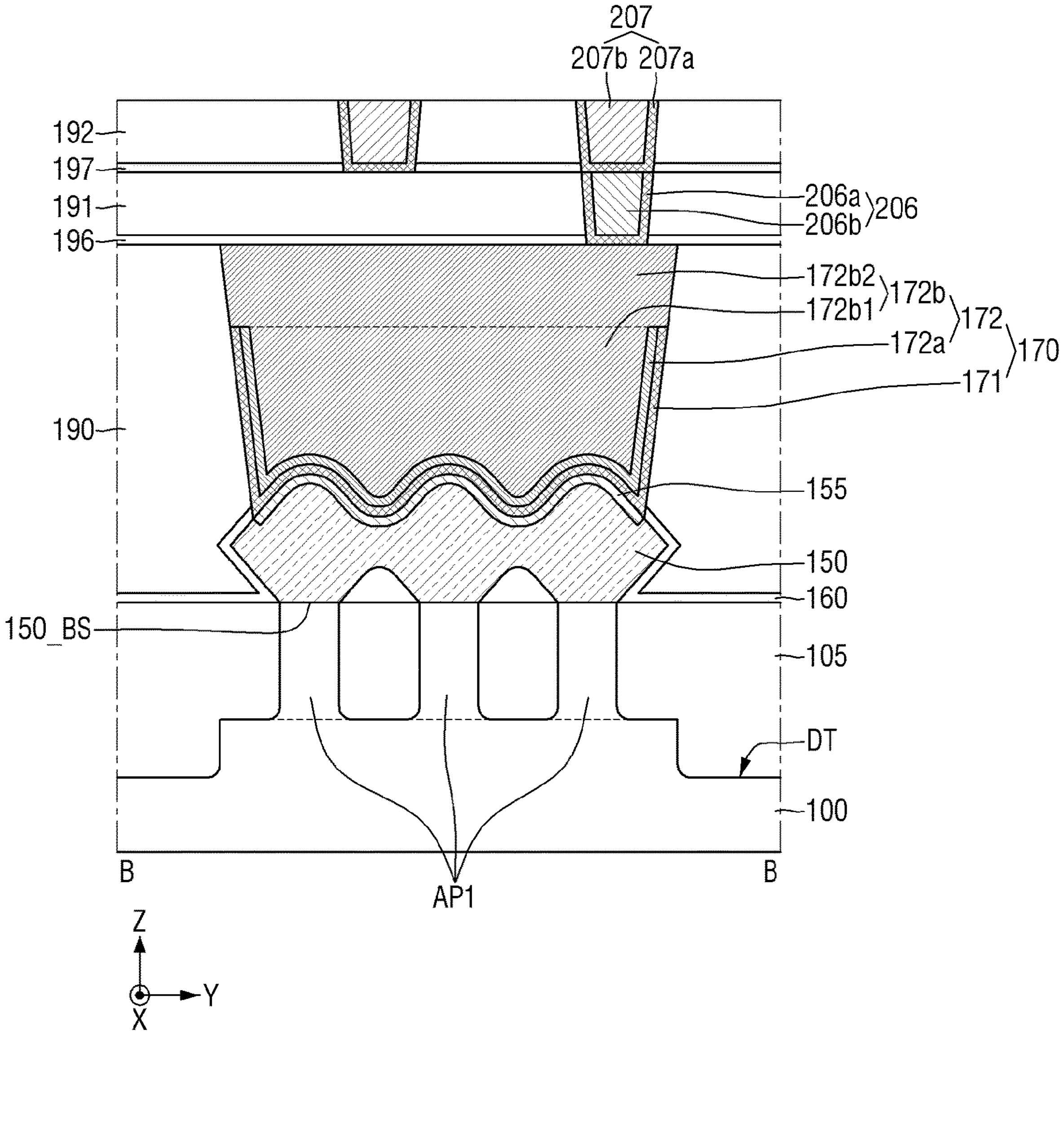

FIGS. 6 and 7 are example cross-sectional views illustrating a semiconductor device according to some other embodiments. For convenience of description, the following description will be based on differences from those described with reference to FIGS. 1 to 5. Referring to FIGS. 6 and 7, a contact silicide layer 155 may be disposed between the first source/drain contact 170 and the source/drain pattern 150. The contact silicide layer 155 is shown as being formed along a profile of a boundary surface between the source/drain pattern 150 and the first source/drain contact 170, but is not limited thereto. A lower surface of the contact silicide layer 155 may be disposed below the upper surface of the source/drain pattern 150. The contact silicide layer 155 may include, for example, a metal silicide material.

The source/drain contact barrier layer 171 may be disposed on the contact silicide layer 155. The source/drain contact barrier layer 171 may be disposed between the contact silicide layer 155 and the source/drain contact filling layer 172. The source/drain contact filling layer 172 may not be in contact with the contact silicide layer 155. The source/drain contact filling layer 172 may be spaced apart from the contact silicide layer 155 with the source/drain contact barrier layer 171 interposed therebetween.

Figure 8:
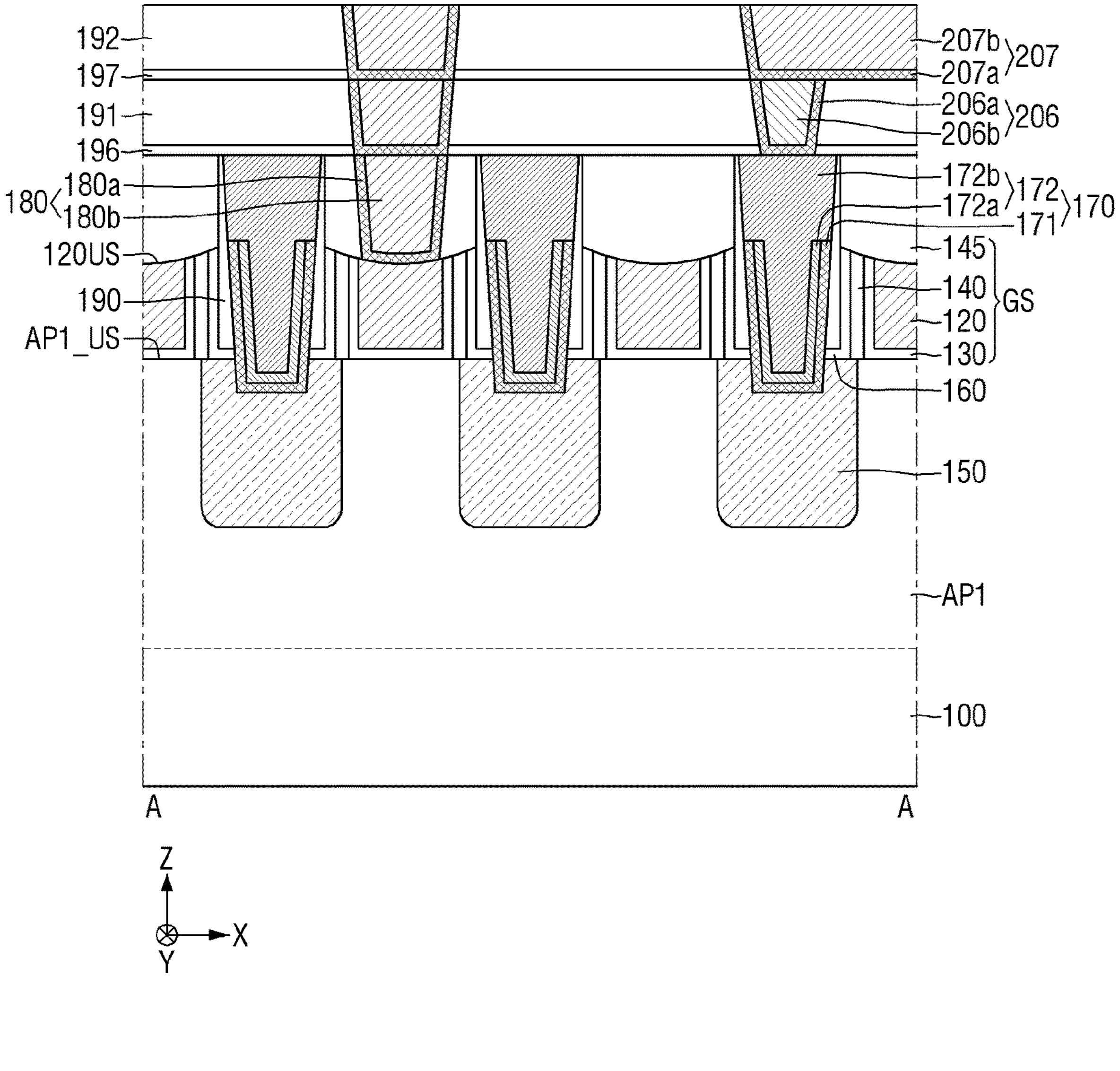
FIGS. 8 and 9 are example cross-sectional views illustrating a semiconductor device according to some other embodiments.
Figure 9:
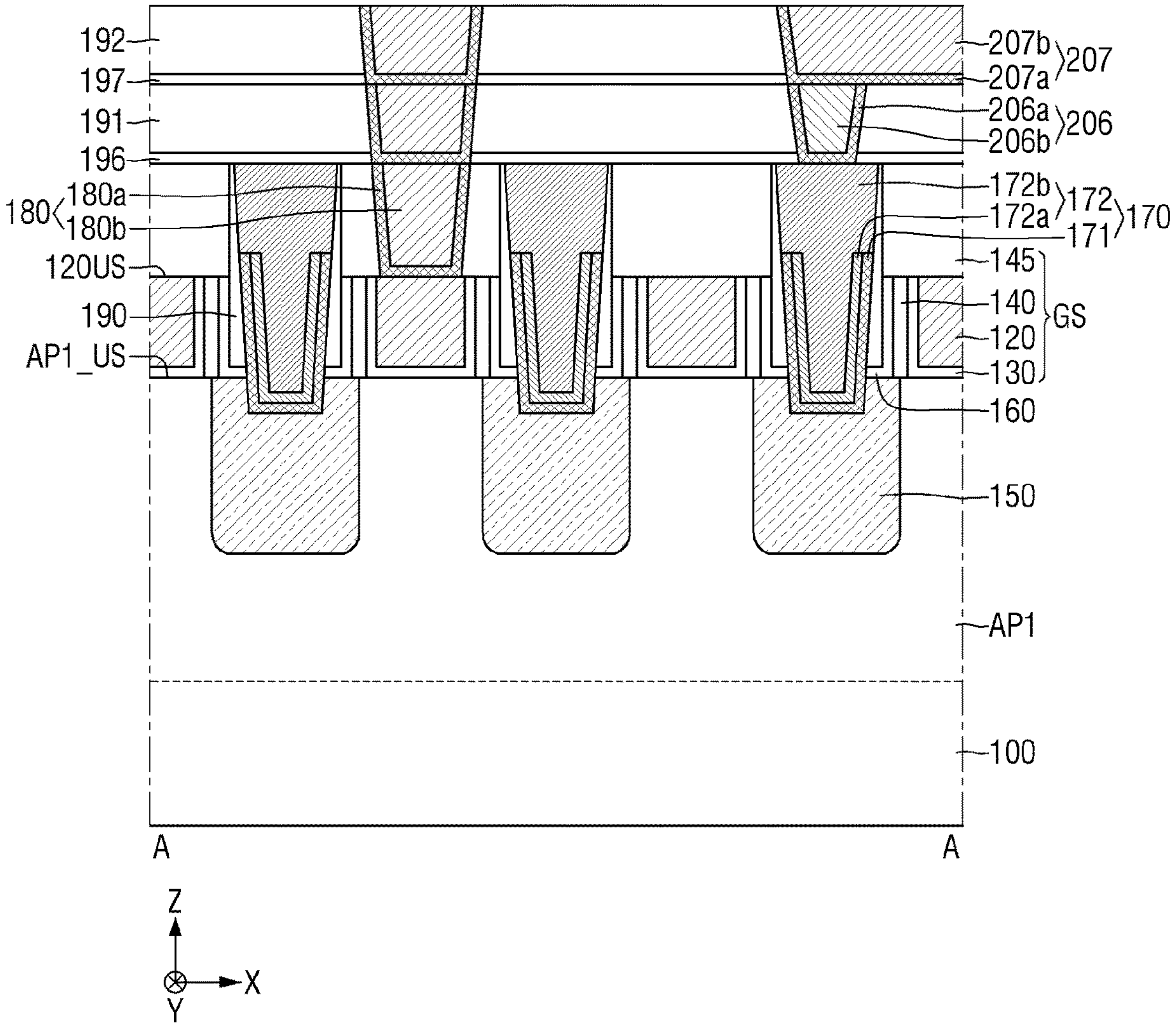

FIGS. 8 and 9 are example cross-sectional views illustrating a semiconductor device according to some other embodiments. For convenience of description, the following description will be based on those described with reference to FIGS. 1 to 5. Referring to FIG. 8, the gate capping layer 145 may be disposed on the source/drain etch stop layer 160. The gate capping layer 145 may cover the upper surface of the source/drain etch stop layer 160. The lower surface of the gate capping layer 145 may be in contact with the upper surface of the source/drain etch stop layer 160. The gate capping layer 145 may overlap the source/drain etch stop layer 160 in the third direction Z. The sidewalls of the gate capping layer 145 may be disposed on the same plane as those of the source/drain etch stop layer 160. The sidewalls of the gate capping layer 145 may be in contact with the first interlayer insulating layer 190. Referring now to FIG. 9, the lower surface of the gate capping layer 145 may be flat. Therefore, the upper surface 120US of the gate electrode may be flat. A height of the lower surface of the gate capping layer 145 may be constant based on the upper surface AP1_US of the active pattern.

Figure 10:
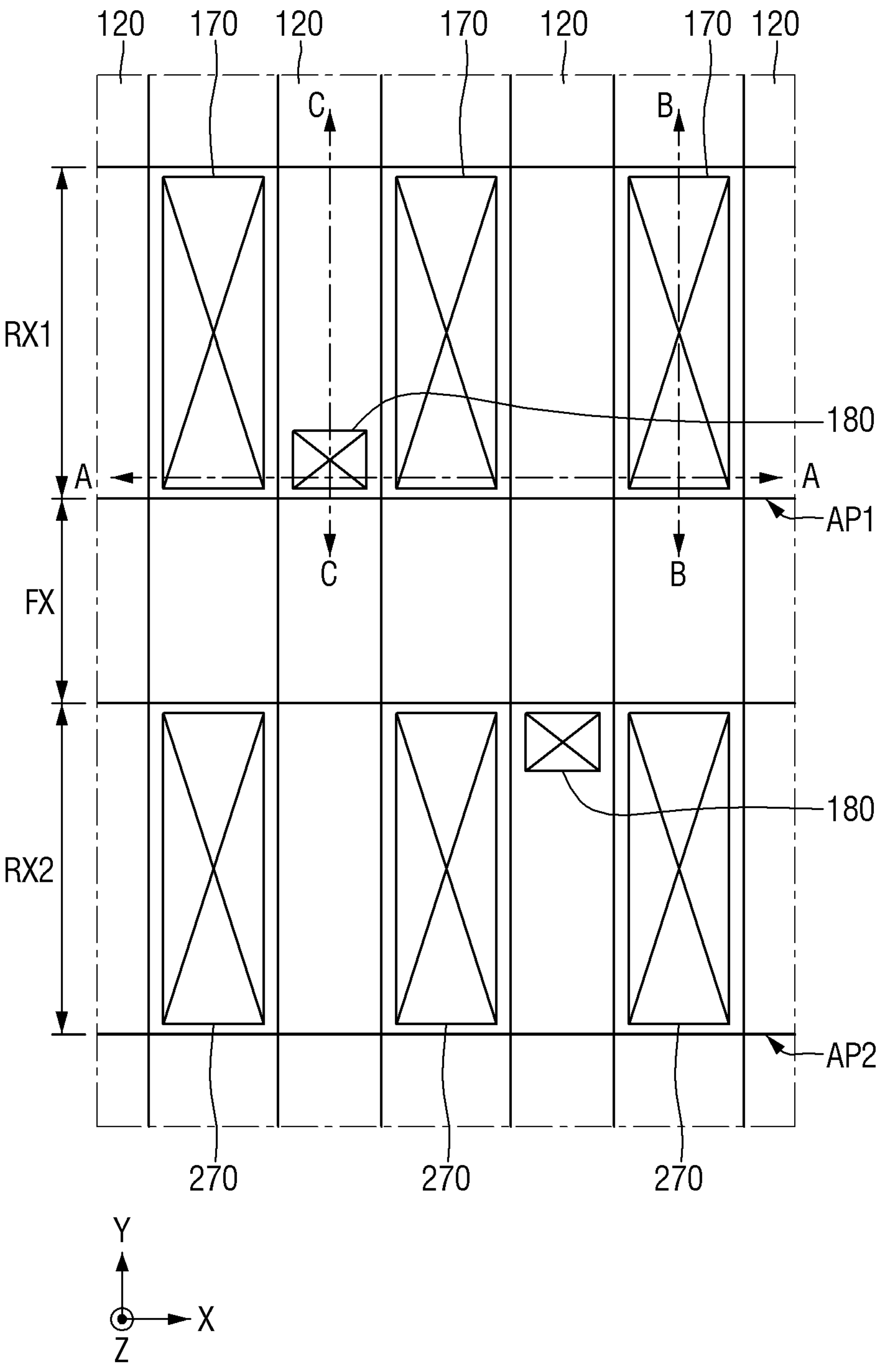
FIGS. 10 to 14 are views illustrating a semiconductor device according to some other embodiments.
Figure 11:
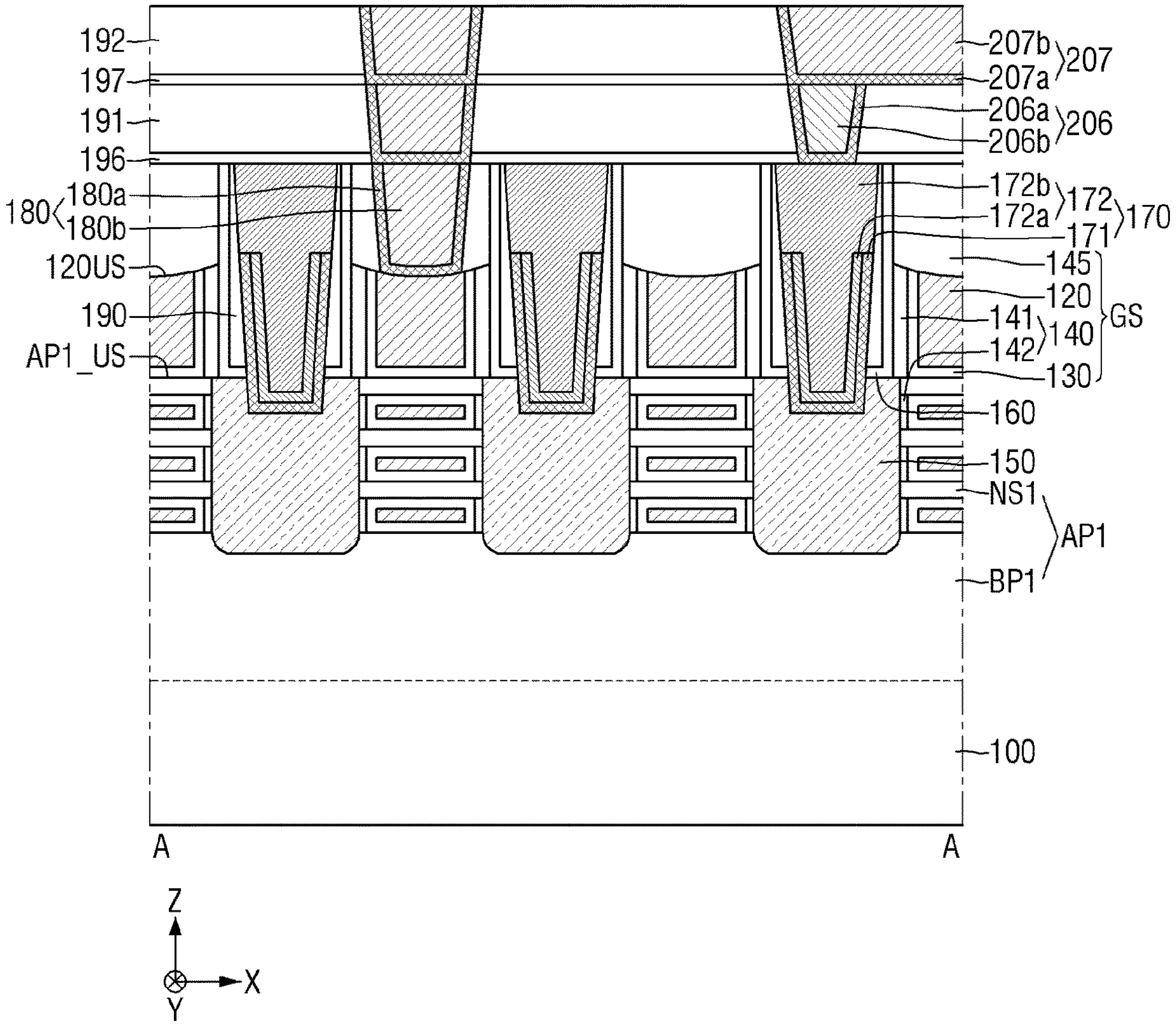
Figure 12:
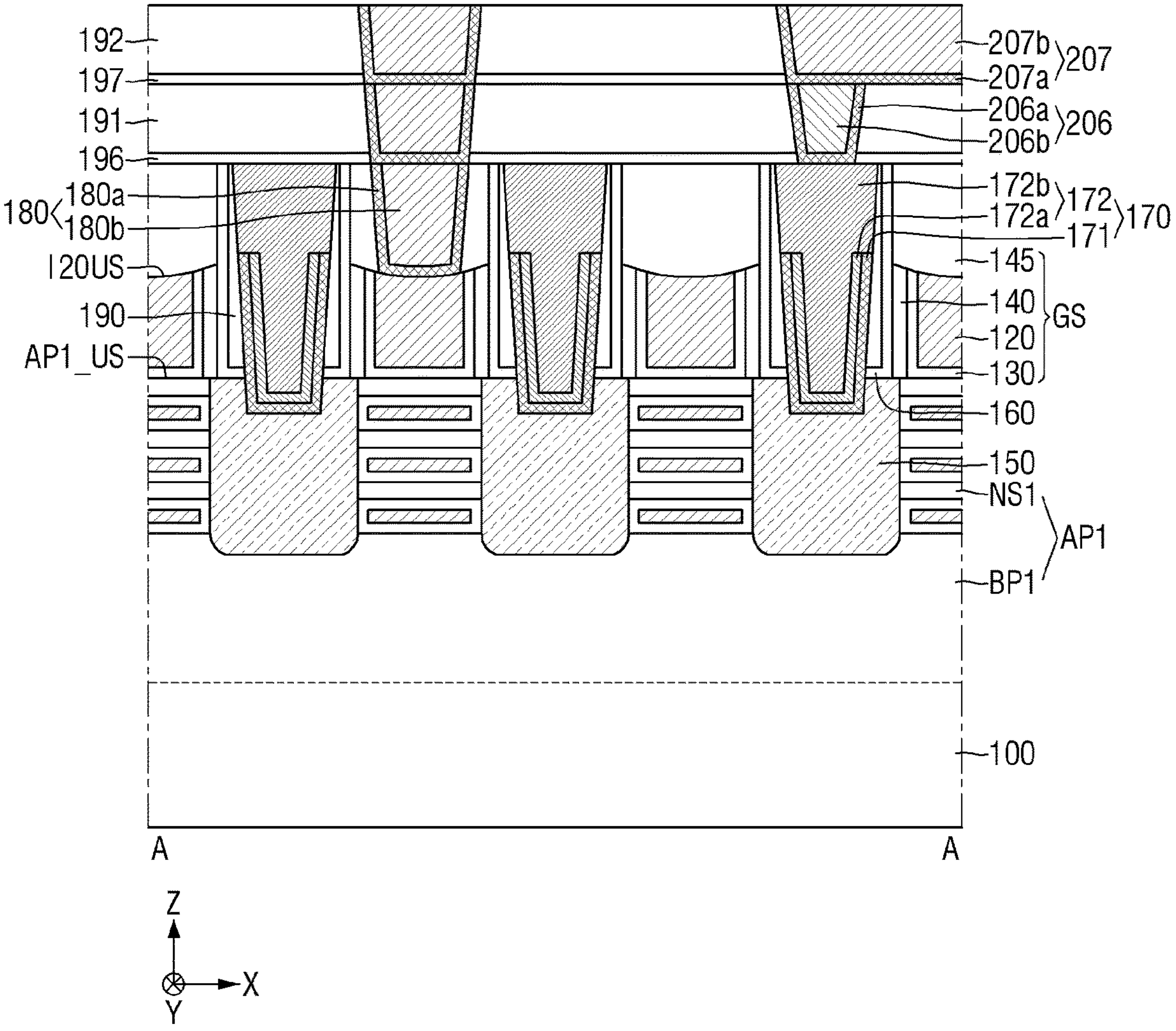
Figure 13:
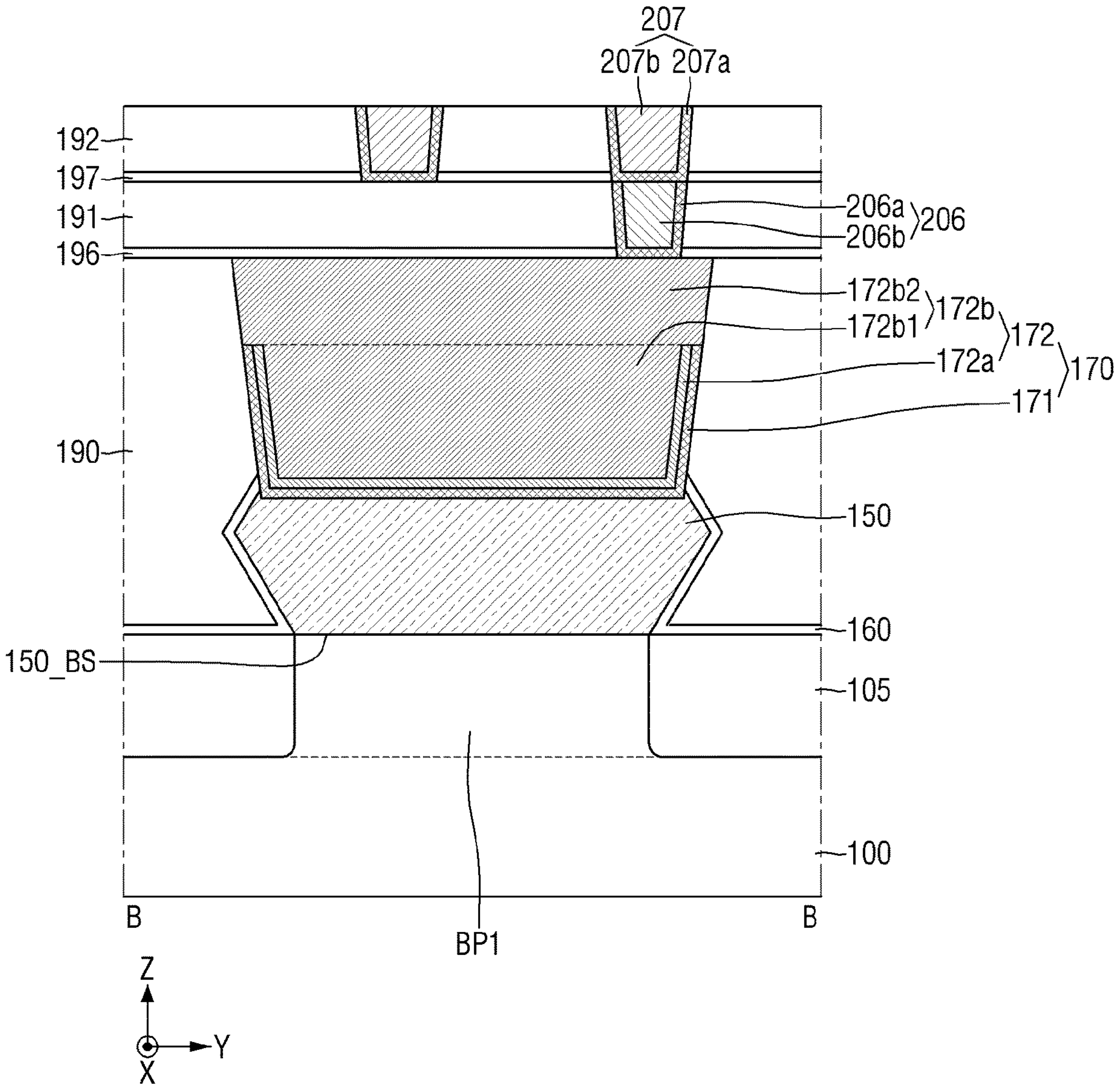
Figure 14:
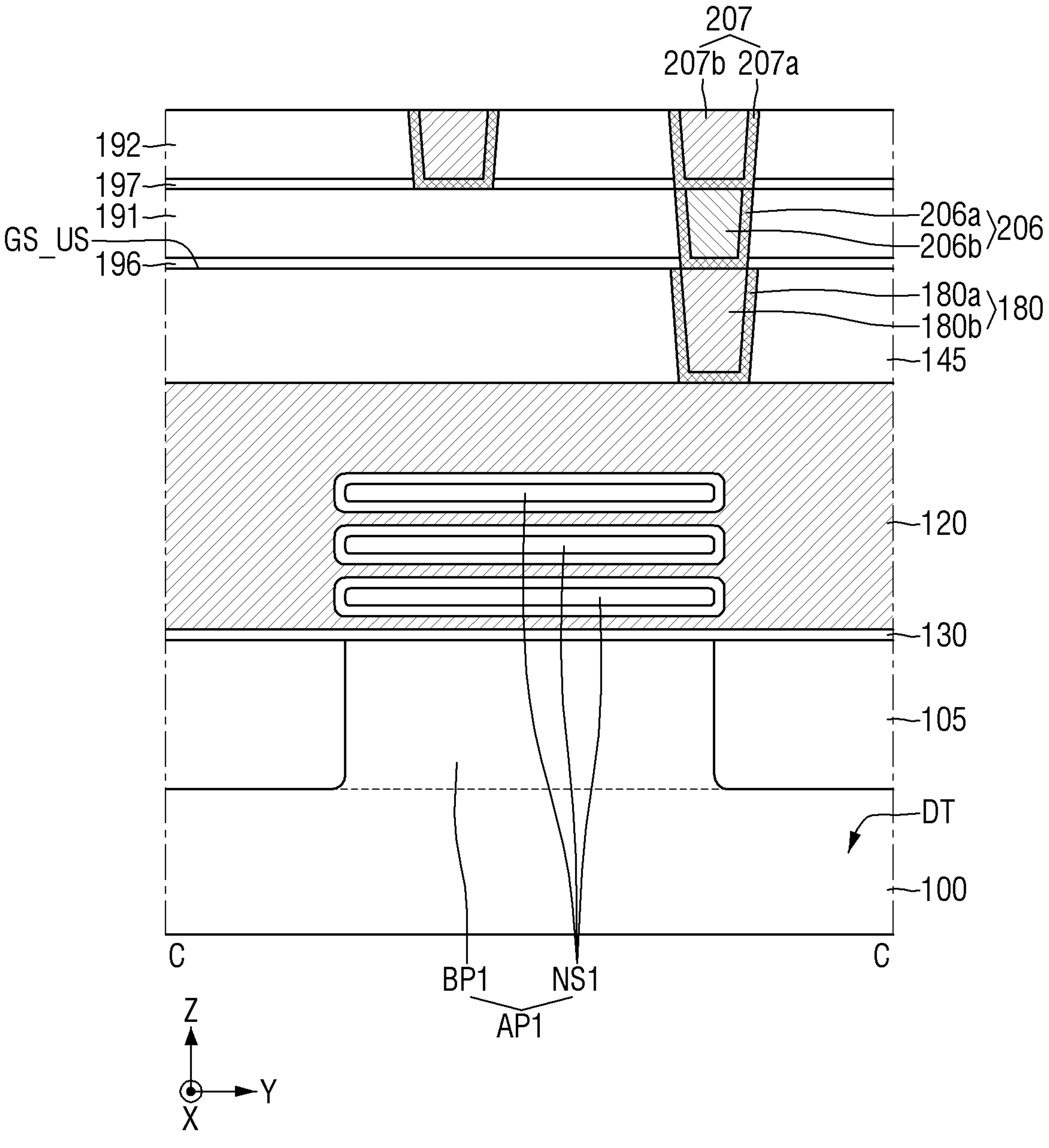

FIGS. 10 to 14 are views illustrating a semiconductor device according to some other embodiments. FIG. 10 is an example layout view illustrating a semiconductor device according to some embodiments; FIGS. 11 and 12 are cross-sectional views taken along line A-A of FIG. 10; FIG. 13 is a cross-sectional view taken along line B-B of FIG. 10; and FIG. 14 is a cross-sectional view taken along line C-C of FIG. 10. For convenience of description, the following description will be based on those described with reference to FIGS. 1 to 5.

Referring to FIGS. 10 to 14, in the semiconductor device according to some embodiments, the first active pattern AP1 may include a lower pattern BP1 and a sheet pattern NS1. Although not shown, the second active pattern AP2 may include a lower pattern and a sheet pattern. The lower pattern BP1 may be extended along the first direction X. The sheet pattern NS1 may be disposed on the lower pattern BP1 by being spaced apart from the lower pattern BP1. As shown, the sheet pattern NS1 may include a plurality of sheet patterns stacked in the third direction Z. Although the sheet pattern NS1 is shown as being three, this is only for convenience of description, and is not limited thereto. The upper surface of the sheet pattern NS1, which is disposed on the uppermost portion, among the sheet patterns NS1 may be the upper surface AP1_US of the first active pattern. The sheet pattern NS1 may be electrically connected to the source/drain pattern 150. The sheet pattern NS1 may be a channel pattern used as the channel region of the transistor. For example, the sheet pattern NS1 may be a nano sheet or a nanowire.

The lower pattern BP1 may include, for example, silicon or germanium, which is an elemental semiconductor material. Alternatively, the lower pattern BP1 may include a compound semiconductor, and may include, for example, a group IV-IV compound semiconductor or a group III-V compound semiconductor.

The sheet pattern NS1 may include, for example, silicon or germanium, which is an elemental semiconductor material. Alternatively, the sheet pattern NS1 may include a compound semiconductor, and may include, for example, a group IV-IV compound semiconductor or a group III-V compound semiconductor.

The gate insulating layer 130 may be extended along the upper surface of the lower pattern BP1 and the upper surface of the field insulating layer 105. The gate insulating layer 130 may surround the periphery of the sheet pattern NS1. In addition, the gate electrode 120 is disposed on the lower pattern BP1. The gate electrode 120 crosses the lower pattern BP1. The gate electrode 120 may surround the periphery of the sheet pattern NS1. The gate electrode 120 may be disposed between the lower pattern BP1 and the sheet pattern NS1 and between adjacent sheet patterns NS1.

In FIG. 11, the gate spacer 140 may include an outer spacer 141 and an inner spacer 142. The inner spacer 142 may be disposed between the lower pattern BP1 and the sheet pattern NS1 and between adjacent sheet patterns NS1. In FIG. 12, the gate spacer 140 may include only an outer spacer (141 of FIG. 11). The inner spacer (142 of FIG. 11) is not disposed between the lower pattern BP1 and the sheet pattern NS1 and between adjacent sheet patterns NS1.

The bottom surface of the first source/drain contact 170 may be positioned between the upper surface of the sheet pattern NS1, which is disposed on the lowermost portion, among the plurality of sheet patterns NS1 and the lower surface of the sheet pattern NS1, which is disposed on the uppermost portion, among the plurality of sheet patterns NS1. Unlike the shown example, the bottom surface of the first source/drain contact 170 may be positioned between the upper surface of the sheet pattern NS1 disposed on the uppermost portion and the lower surface of the sheet pattern NS1 disposed on the uppermost portion.

Since the source/drain contact barrier layer 171, the intermediate liner layer 172*a* of the source/drain contact filling layer 172 and the first portion 172*b*1 and the second portion 172*b*2 of the upper filling layer 172*b* of the source/drain contact filling layer 172 are substantially the same as those described with reference to FIGS. 1 to 5, their description will be omitted.

Figure 15:
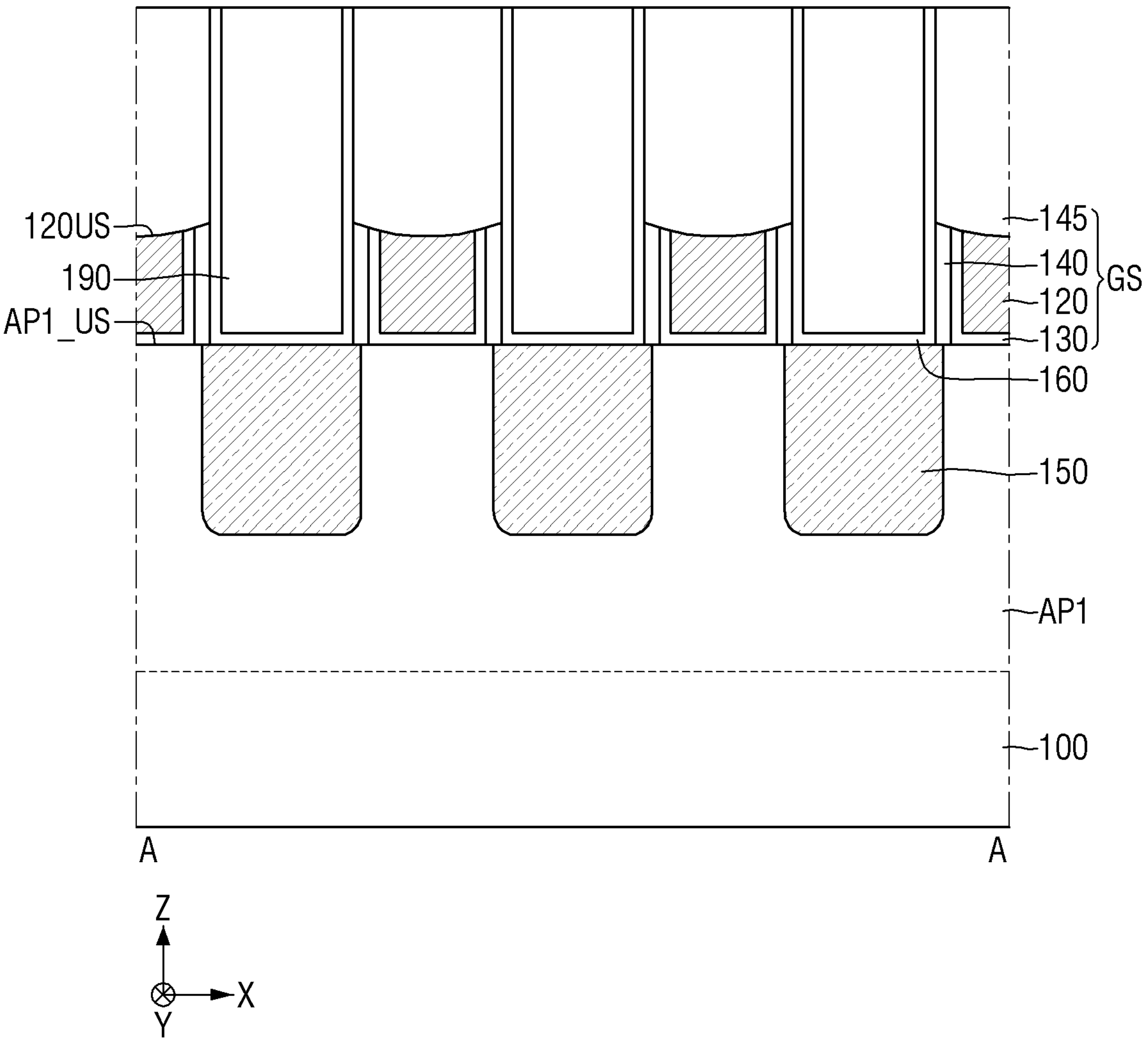
FIGS. 15 to 24 are views illustrating intermediate steps to describe a method of fabricating a semiconductor device according to some embodiments.

FIGS. 15 to 24 are views illustrating intermediate steps to describe a method of fabricating a semiconductor device according to some embodiments. Referring to FIG. 15, the source/drain pattern 150 may be formed on the first active pattern AP1. The source/drain etch stop layer 160 and the first interlayer insulating layer 190 are sequentially formed on the source/drain pattern 150. After the first interlayer insulating layer 190 is formed, the gate structure GS may be formed through a replacement metal gate (RMG) process. The gate capping layer 145 may be formed between the source/drain etch stop layers 160.

Figure 16:
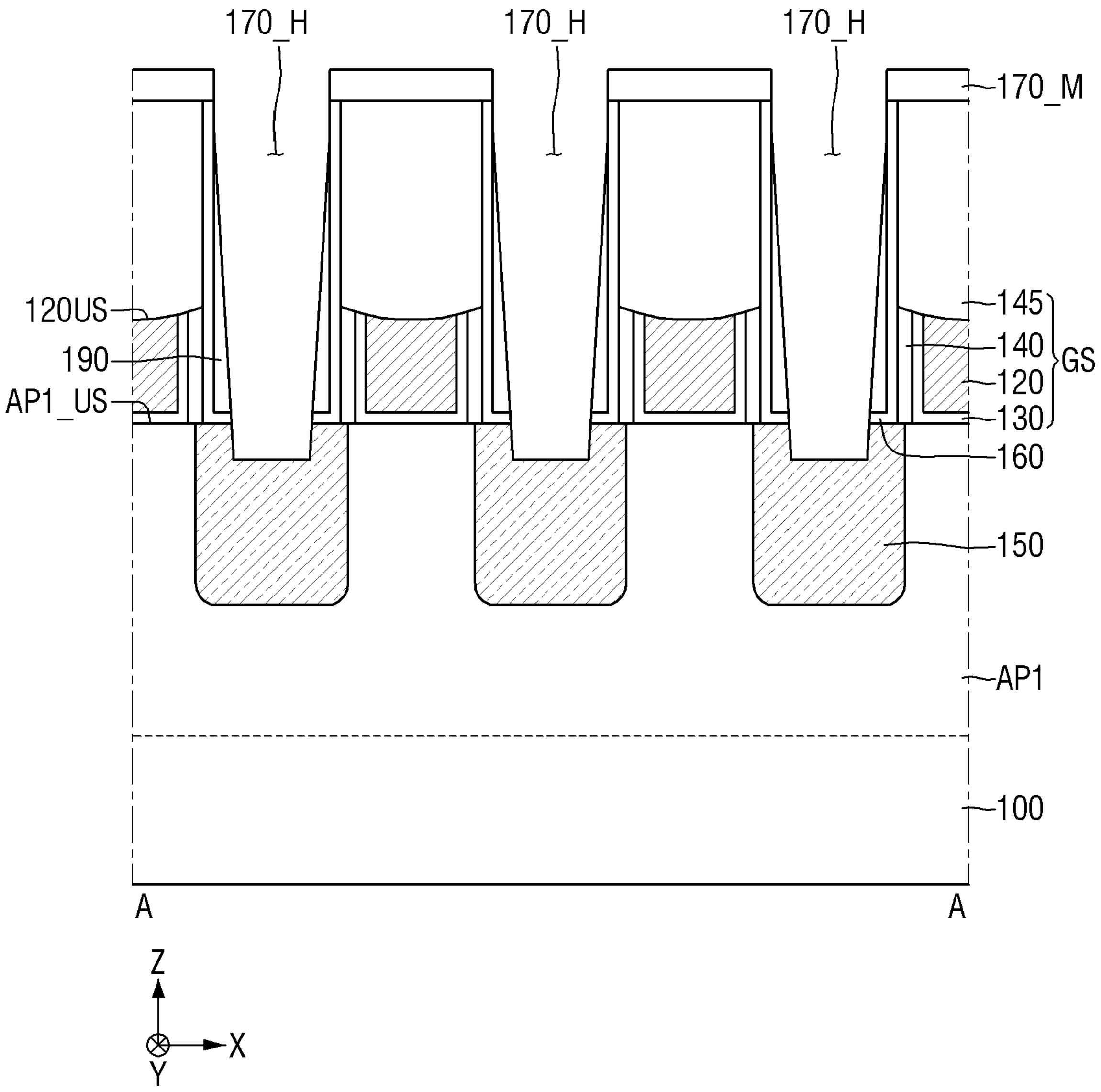

Referring to FIG. 16, the source/drain contact hole 170_H may be formed in the first interlayer insulating layer 190. In detail, a mask buffer layer may be formed on the gate structure GS. The mask buffer layer may be extended along the upper surface of the gate structure GS and the upper surface of the first interlayer insulating layer 190. A mask pattern may be formed on the mask buffer layer. The mask pattern may include a pattern for forming the source/drain contact hole 170_H. The mask buffer layer may include, for example, an oxide, but is not limited thereto.

The source/drain contact hole 170_H may be formed in the first interlayer insulating layer 190 by using the mask pattern as a mask. While the source/drain contact hole 170_H is being formed, the mask buffer layer may be patterned. As the mask buffer layer is patterned, a mask buffer pattern 170_M may be formed on the gate structure GS. The mask buffer pattern 170_M may include, for example, an oxide, but is not limited thereto.

The source/drain contact hole 170_H may expose the source/drain etch stop layer 160 and the source/drain pattern 150. The source/drain contact hole 170_H may pass through the source/drain etch stop layer 160. While the source/drain contact hole 170_H is being formed, a portion of the source/drain etch stop layer 160 may be removed. While the source/drain contact hole 170_H is being formed, a portion of the source/drain pattern 150 may be removed.

Figure 17:
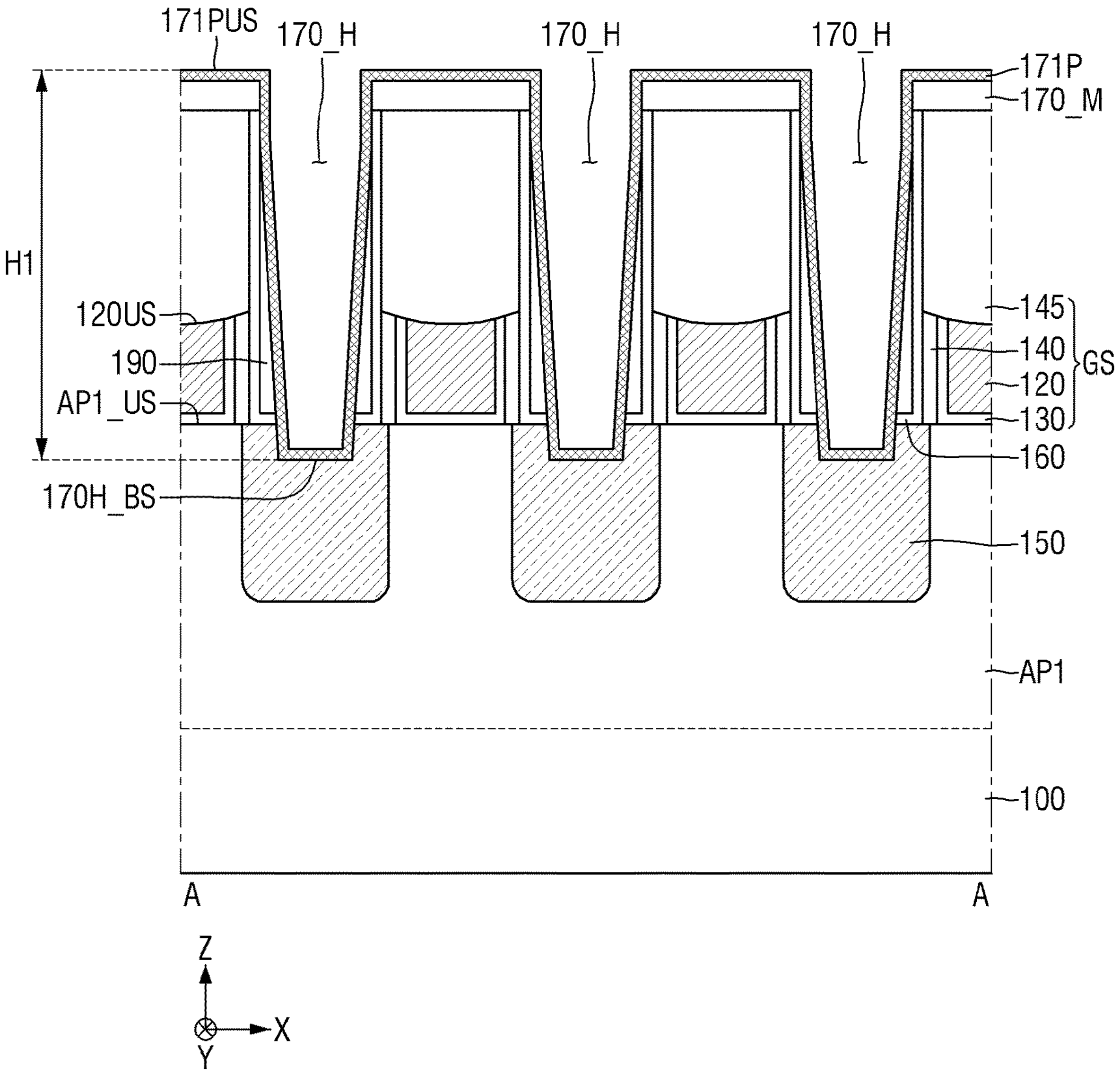

Referring to FIG. 17, a pre-source/drain contact barrier layer 171P may be formed along sidewalls and a bottom surface 170H_BS of the source/drain contact hole 170_H. The pre-source/drain barrier layer 171P may be formed along an upper surface of the mask buffer pattern 170_M. The pre-source/drain contact barrier layer 171P may be formed using, for example, a chemical vapor deposition (CVD) method. The pre-source/drain contact barrier layer 171P may be formed in the source/drain contact hole 170_H. The pre-source/drain contact barrier layer 171P may cover the entire sidewalls of the source/drain contact hole 170_H. The pre-source/drain contact barrier layer 171P may be extended along the entire sidewalls of the source/drain contact hole 170_H. The upper surface 171PUS of the pre-source/drain contact barrier layer may have a first height H1 based on the bottom surface 170H_BS of the source/drain contact hole.

Figure 18:
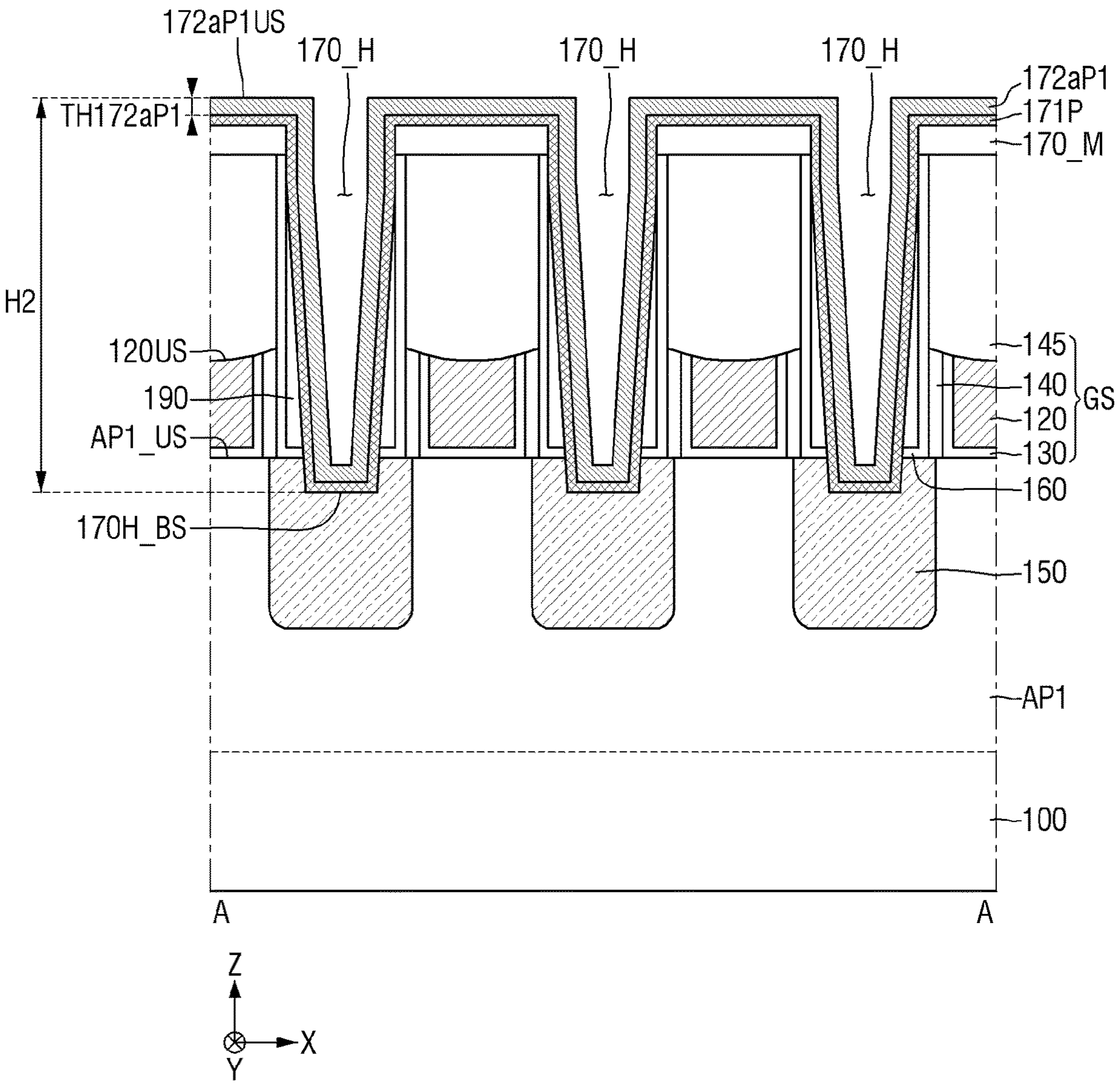

Referring to FIG. 18, a first pre-intermediate liner layer 172*a*P1 may be formed on the pre-source/drain barrier layer 171P. The first pre-intermediate liner layer 172*a*P1 may be extended along the pre-source/drain barrier layer 171P. The first pre-intermediate liner layer 172*a*P1 may be formed in the source/drain contact hole 170_H. The first pre-intermediate liner layer 172*a*P1 may cover the pre-source/drain barrier layer 171P in the source/drain contact hole 170_H. An upper surface 172*a*P1US of the first pre-intermediate liner layer may have a second height H2 based on the bottom surface 170H_BS of the source/drain contact hole.

The first pre-intermediate liner layer 172*a*P1 may have a first thickness TH172*a*P1. The first thickness TH172*a*P1 may refer to a thickness from the upper surface of the pre-source/drain barrier layer 171P to an upper surface of the first pre-intermediate liner layer 172*a*P1. The first pre-intermediate liner layer 172*a*P1 may include, for example, tungsten.

Figure 19:
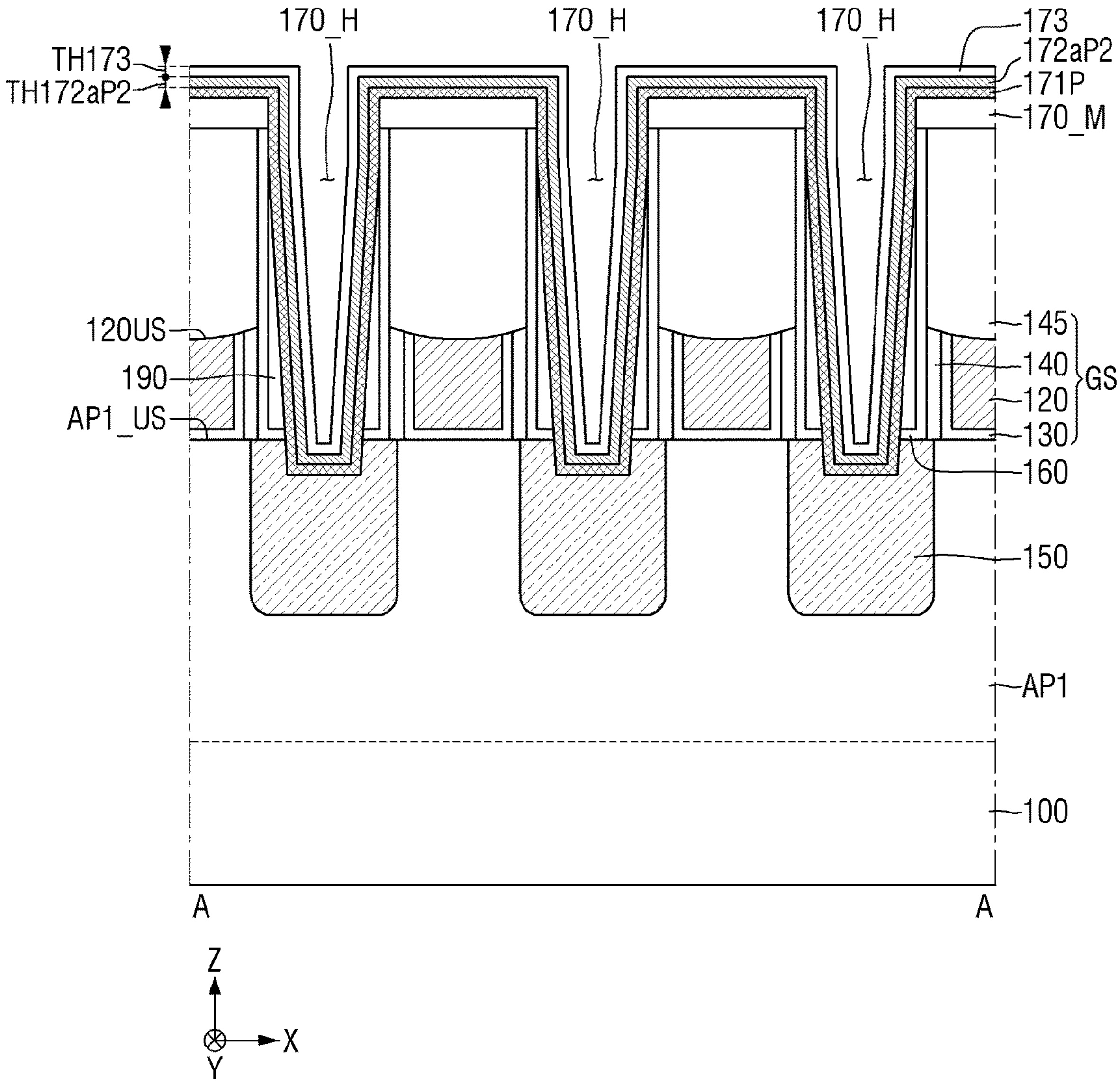

Referring to FIG. 19, a passivation layer 173 may be formed. As the passivation layer 173 is formed, a second pre-intermediate liner layer 172*a*P2 may be formed. The passivation layer 173 may be formed as a portion of the first pre-intermediate liner layer (172*a*P1 of FIG. 18) is oxidized. The passivation layer 173 may be formed by oxidizing the surface of the first pre-intermediate liner layer (172*a*P1 of FIG. 18). The passivation layer 173 may include a film in which a portion of the first pre-intermediate liner layer (172*a*P1 of FIG. 18) is oxidized. For example, the passivation layer 173 may include tungsten oxide. The passivation layer 173 may be formed on the second pre-intermediate liner layer 172*a*P2. The passivation layer 173 may be extended along the second pre-intermediate liner layer 172*a*P2. The passivation layer 173 may completely cover the second pre-intermediate liner layer 172*a*P2. The second pre-intermediate liner layer 172$a$P2 may have a second thickness TH172$a$P2. The second thickness TH172$a$P2 may refer to a thickness from the upper surface of the pre-source/drain barrier layer 171P to an upper surface of the second pre-intermediate liner layer 172$a$P2. The second thickness TH172$a$P2 of the second pre-intermediate liner layer 172$a$P2 may be smaller than the first thickness (TH172$a$P1 of FIG. 18) of the first pre-intermediate liner layer (172$a$P1 of FIG. 18). That is, as the passivation layer 173 is formed, the thickness of the pre-intermediate liner layer may be reduced.

The passivation layer 173 may have a third thickness TH173. The third thickness TH173 may refer to a thickness from the upper surface of the second pre-intermediate liner layer 172$a$P2 to an upper surface of the passivation layer 173. According to some embodiments, an algebraic sum of the third thickness TH173 of the passivation layer 173 and the second thickness TH172Ap2 of the second pre-intermediate liner layer 172$a$P2 may be the same as the first thickness (TH172$a$P1 of FIG. 18) of the first pre-intermediate liner layer (172$a$P1 of FIG. 18), but the embodiments are not limited thereto. For example, the sum of the third thickness TH173 of the passivation layer 173 and the second thickness TH172Ap2 of the second pre-intermediate liner layer 172$a$P2 may be greater than the first thickness (TH172$a$P1 of FIG. 18) of the first pre-intermediate liner layer (172$a$P1 of FIG. 18).

Figure 20:
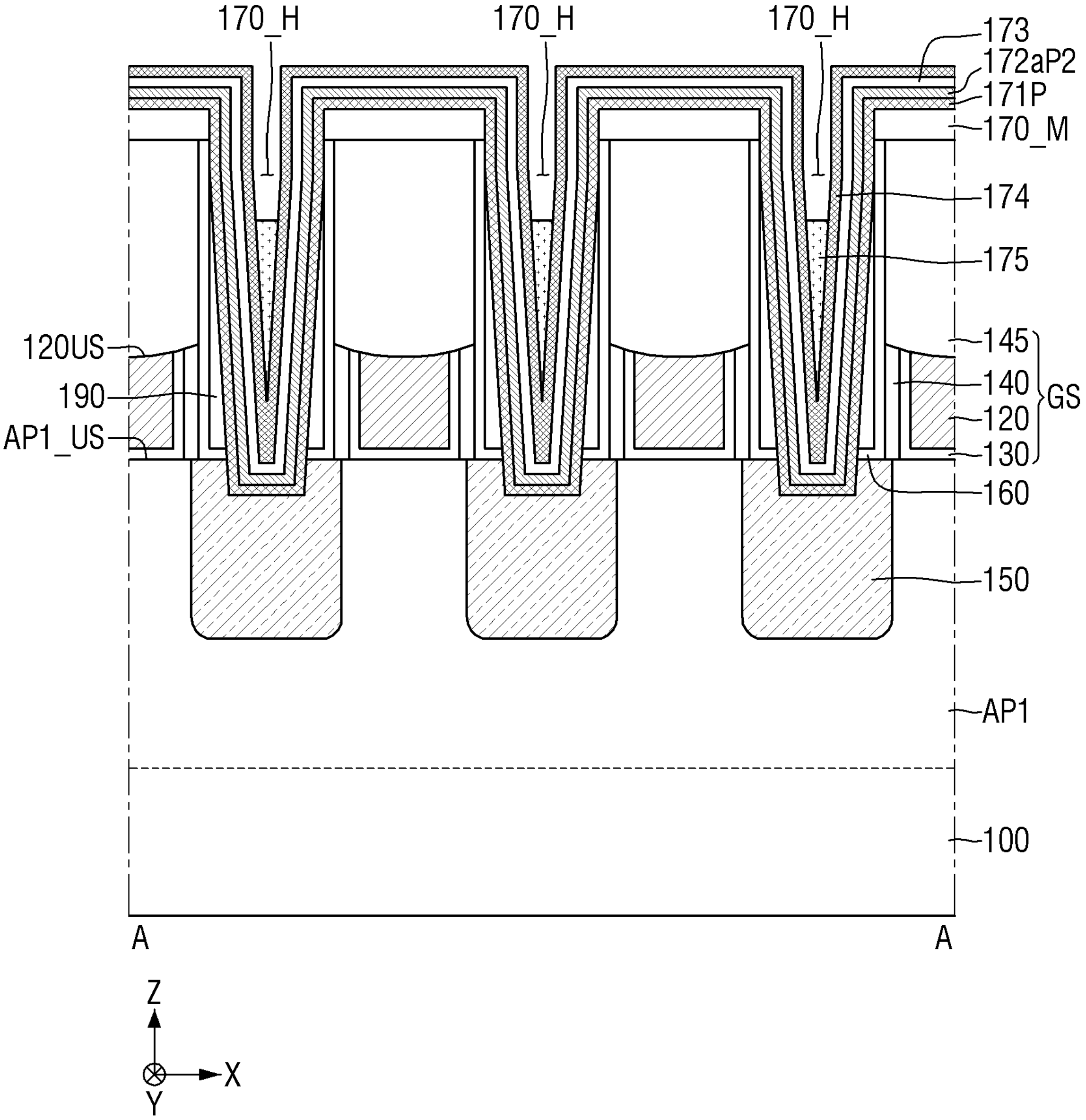

Referring to FIG. 20, a mask layer 175 may be formed on the passivation layer 173. As the mask layer 175 is formed, an impurity layer 174 may be formed. The mask layer 175 may be formed on the impurity layer 174. The mask layer 175 may fill the source/drain contact hole 170_H. The mask layer 175 may include, for example, a spin-on hard mask (SOH), but the embodiments are not limited thereto. The mask layer 175 may include carbon (C). When the mask layer 175 is formed, the impurity layer 174 may be formed due to a reason for a process. The impurity layer 174 may be formed on the passivation layer 173. The impurity layer 174 may be extended along the passivation layer 173. The impurity layer 174 may completely cover the passivation layer 173. The impurity layer 174 may include, for example, one of tungsten (W), oxygen (O), nitrogen (N), fluorine (F) and carbon (C) or their combination.

Figure 21:
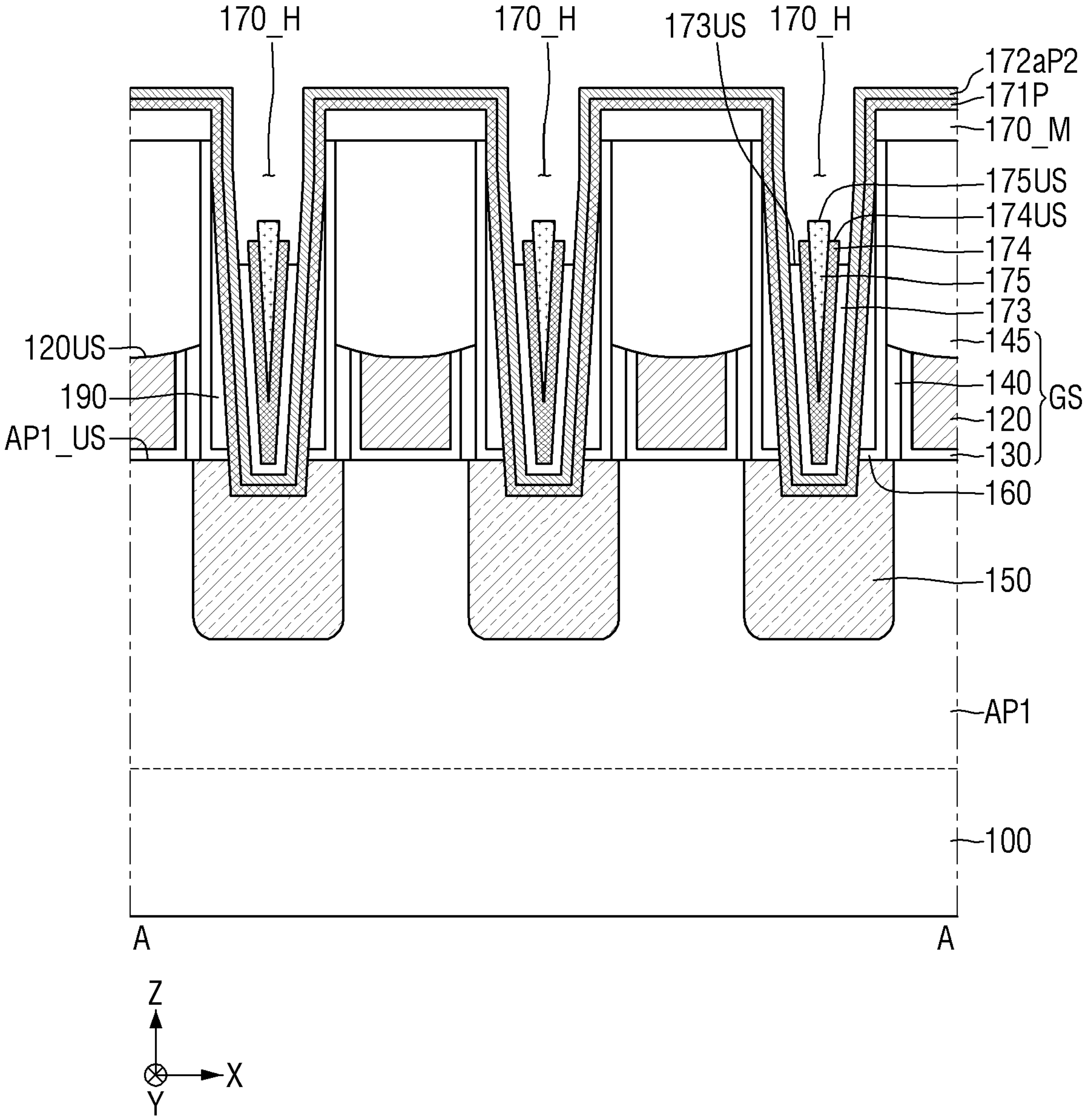

Referring to FIG. 21, the passivation layer 173 and the impurity layer 174 may be partially removed. Upper portions of the passivation layer 173 and the impurity layer 174 may be partially removed. The passivation layer 173 and the impurity layer 174 may be removed by, for example, a wet etching process using ammonia water ($NH_4OH$). As the upper portions of the passivation layer 173 and the impurity layer 174 are removed, the second pre-intermediate liner layer 172$a$P2 may be exposed.

When the passivation layer 173 and the impurity layer 174 are partially removed, the mask layer 175 may not be removed. For example, when a part of the passivation layer 173 and the impurity layer 174 is removed, the height of the upper surface 175US of the mask layer may not be changed. When a portion of the passivation layer 173 and the impurity layer 174 is removed, the passivation layer 173 may be more removed than the impurity layer 174 due to a difference in an etch rate. For example, an upper surface 173US of the passivation layer may be lower than an upper surface 174US of the impurity layer based on the upper surface AP1_US of the active pattern. Also, the upper surface 173US of the passivation layer and the upper surface 174US of the impurity layer may be lower than the upper surface 175US of the mask layer based on the upper surface AP1_US of the active pattern.

Figure 22:
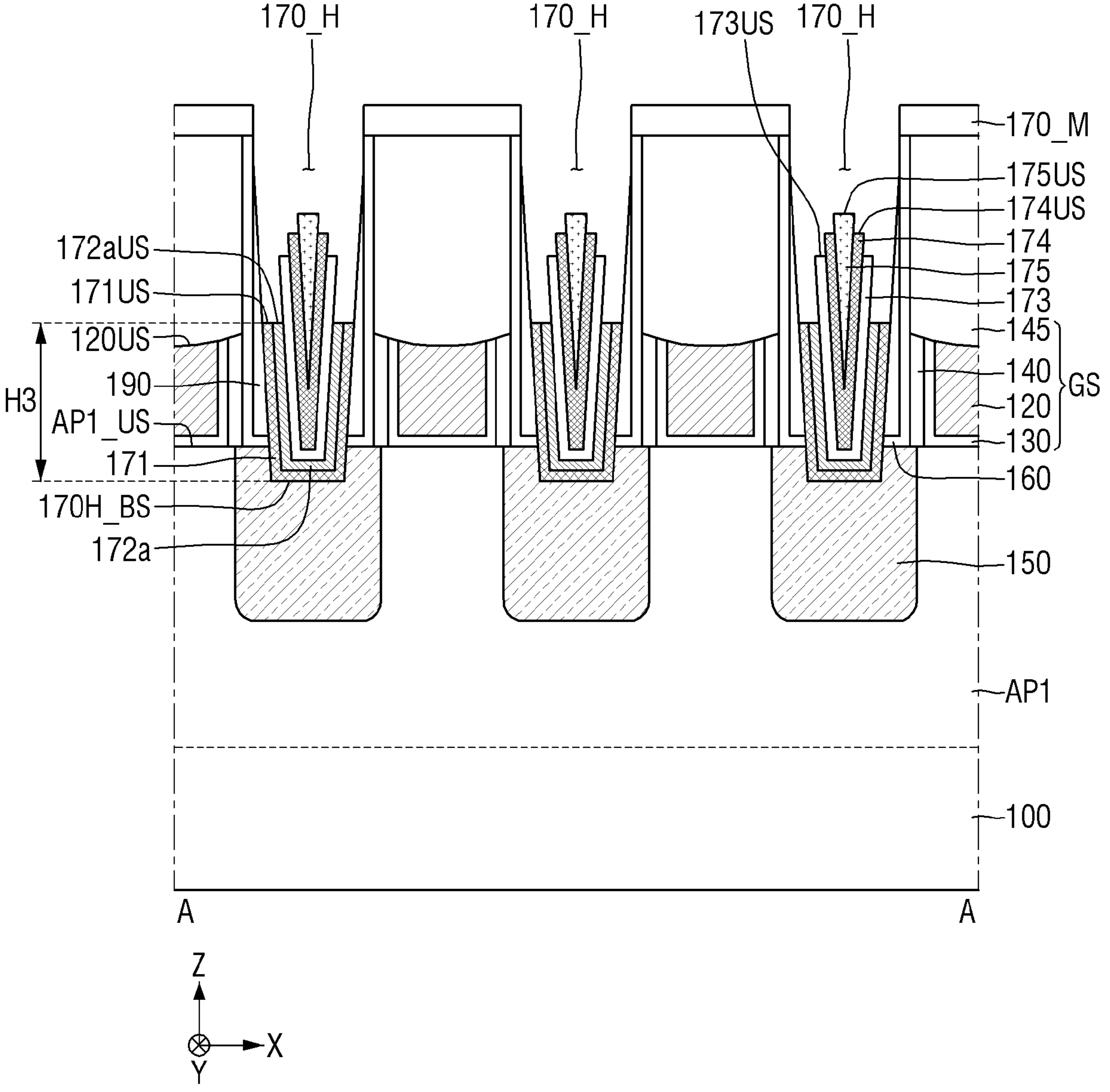

Referring to FIG. 22, the source/drain contact barrier layer 171 and the intermediate liner layer 172$a$ may be formed. A portion of the second pre-intermediate liner layer (172$a$P2 of FIG. 21) and the pre-source/drain contact barrier layer (171P of FIG. 21) may be removed. Only a portion of the second pre-intermediate liner layer (172$a$P2 of FIG. 21) and the pre-source/drain contact barrier layer (171P of FIG. 21) may be removed by using the mask layer 175. As the second pre-intermediate liner layer (172$a$P2 of FIG. 21) and the pre-source/drain contact barrier layer (171P of FIG. 21) are removed, the sidewalls of the source/drain contact hole 170_H may be exposed.

The upper surface 171US of the source/drain contact barrier layer and the upper surface 172$a$US of the intermediate liner layer may be disposed on the same plane. The upper surface 171US of the source/drain contact barrier layer and the upper surface 172$a$US of the intermediate liner layer may have the same height based on the bottom surface 170H_BS of the source/drain contact hole. For example, the upper surface 171US of the source/drain contact barrier layer and the upper surface 172$a$US of the intermediate liner layer may have a third height H3 based on the bottom surface 170H_BS of the source/drain contact hole.

The third height H3 of the upper surface 171US of the source/drain contact barrier layer may be lower than the first height (H1 of FIG. 17) of the upper surface (171PUS of FIG. 17) of the pre-source/drain contact barrier layer. As the upper portion of the pre-source/drain contact barrier layer (171P of FIG. 21) is removed using the mask layer 175, the source/drain contact barrier layer 171 may be formed. The third height H3 of the upper surface 172$a$US of the intermediate liner layer may be lower than the second height (H2 of FIG. 18) of the upper surface (172$a$P1US of FIG. 18) of the first pre-intermediate liner layer. As the upper portion of the second pre-intermediate liner layer (172$a$P2 of FIG. 21) is removed using the mask layer 175, the intermediate liner layer 172$a$ may be formed. The upper surface 171US of the source/drain contact barrier layer and the upper surface 172$a$US of the intermediate liner layer may be disposed below the upper surface 173US of the passivation layer, the upper surface 174US of the impurity layer and the upper surface 175US of the mask layer.

Figure 23:
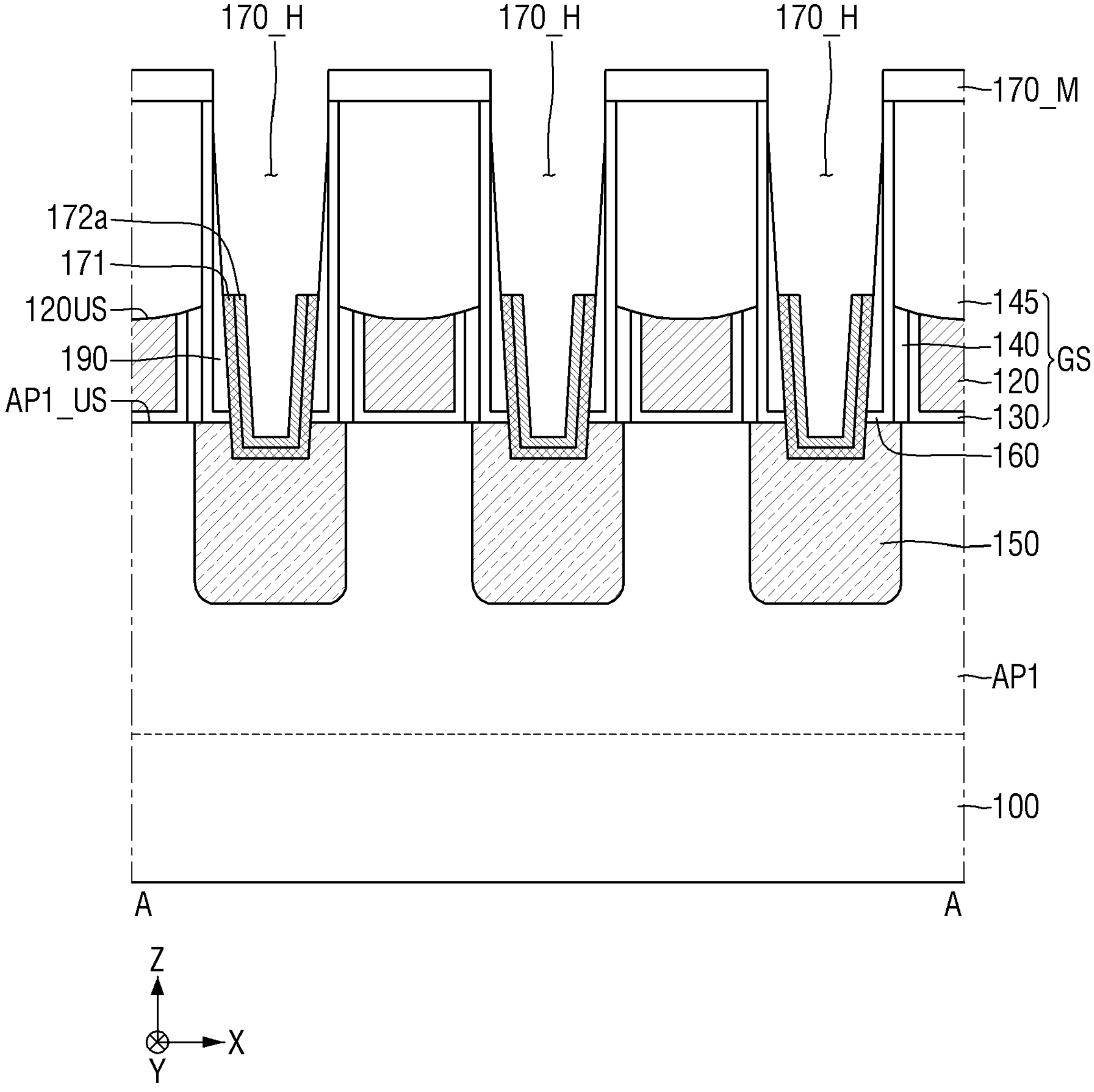

Referring to FIG. 23, the passivation layer (173 of FIG. 22), the impurity layer (174 of FIG. 22) and the mask layer (175 of FIG. 22) may be removed. The passivation layer (173 of FIG. 22), the impurity layer (174 of FIG. 22) and the mask layer (175 of FIG. 22) may be removed, for example, through a wet etching process using ammonia water ($NH_4OH$). As the passivation layer (173 of FIG. 22) is disposed between the source/drain contact barrier layer 171 and the intermediate liner layer 172$a$ and the impurity layer (174 of FIG. 22), the impurity layer (174 of FIG. 22) may be completely removed.

The impurity layer (174 of FIG. 22) may not be easily removed through a wet etching process using ammonia water ($NH_4OH$). On the other hand, the passivation layer (173 of FIG. 22) may be easily removed through a wet etching process using ammonia water ($NH_4OH$). Therefore, the impurity layer (174 of FIG. 22) formed on the passivation layer (173 of FIG. 22) may be removed together with the passivation layer (173 of FIG. 22) as the passivation layer 173 is removed. As the impurity layer (174 of FIG. 22) is removed, an amorphous layer may not be disposed on the intermediate liner layer 172$a$. As the passivation layer (173 of FIG. 22), the impurity layer (174 of FIG. 22) and the mask layer (175 of FIG. 22) are removed, the intermediate liner layer 172*a* may be exposed.

Figure 24:
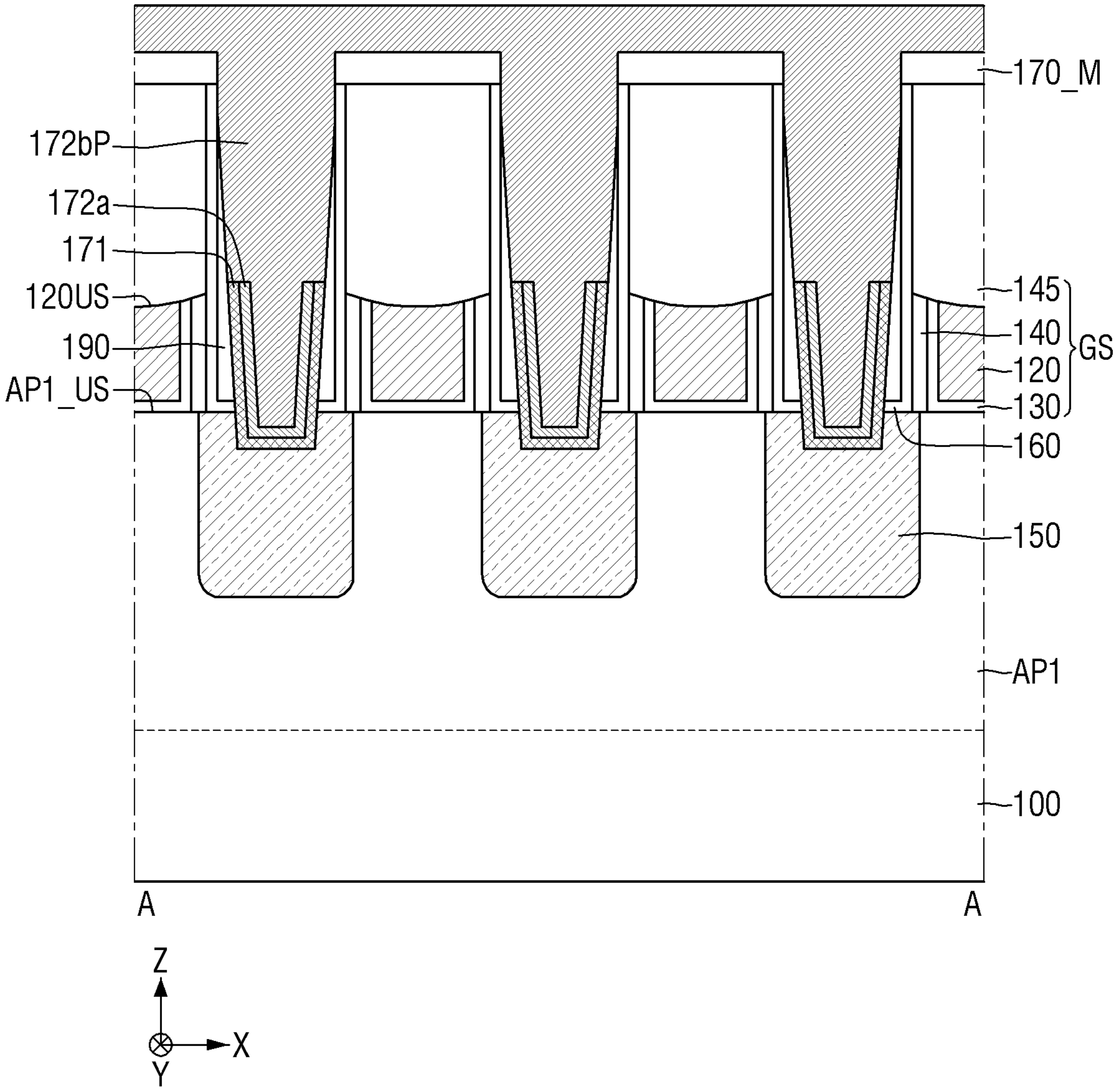

Referring to FIG. 24, a pre-upper filling layer 172*b*P may be formed. The pre-upper filling layer 172*b*P may fill the source/drain contact hole (170_H of FIG. 23). The pre-upper filling layer 172*b*P may cover the intermediate liner layer 172*a* in the source/drain contact hole 170_H. The pre-upper filling layer 172*b*P may be extended along the sidewalls of the source/drain contact hole 170_H on the source/drain contact barrier layer 171 and the intermediate liner layer 172*a*. The pre-upper filling layer 172*b*P may cover a portion of the sidewalls of the source/drain contact hole 170_H exposed on the source/drain contact barrier layer 171 and the intermediate liner layer 172*a*. The pre-upper filling layer 172*b*P may be formed using a chemical vapor deposition (CVD) method or a physical vapor deposition (PVD) method.

The pre-upper filling layer 172*b*P may not be directly in contact with the source/drain contact barrier layer 171. The pre-upper filling layer 172*b*P may be spaced apart from the source/drain contact barrier layer 171 with the intermediate liner layer 172*a* interposed therebetween. On the other hand, the intermediate liner layer 172*a* may be directly in contact with the source/drain contact barrier layer 171. Therefore, an average grain size of the pre-upper filling layer 172*b*P may be larger that of the intermediate liner layer 172*a*. For example, although each of the pre-upper filling layer 172*b*P and the intermediate liner layer 172*a* includes tungsten, the average grain size of the pre-upper filling layer 172*b*P may be larger than that of the intermediate liner layer 172*a*.

Since the pre-upper filling layer 172*b*P is formed on the intermediate liner layer 172*a* after the impurity layer (174 of FIG. 22) is completely removed, the pre-upper filling layer 172*b*P in the source/drain contact hole (170_H of FIG. 23) may have the same average grain size. In detail, when the pre-upper filling layer 172*b*P is formed on the impurity layer (174 of FIG. 22) in a state that the impurity layer (174 of FIG. 22) is not completely removed, the average grain size of the pre-upper filling layer 172*b*P that overlaps the impurity layer (174 of FIG. 22) may be smaller than that of the pre-upper filling layer 172*b*P that does not overlap the impurity layer (174 of FIG. 22).

In the pre-upper filling layer 172*b*P formed to be spaced apart from the source/drain contact barrier layer 171 after the impurity layer (174 of FIG. 22) is completely removed, the first portion (172*b*1 of FIG. 3), which overlaps the source/drain contact barrier layer 171, has the same average grain size as that of the second portion (172*b*2 of FIG. 3) that does not overlap the source/drain contact barrier layer 171. The average grain size of the pre-upper filling layer 172*b*P may be larger than that of the intermediate liner layer 172*a*. When the average grain size is larger, resistance may be reduced.

Subsequently, referring to FIG. 2, a portion of the pre-upper filling layer 172*b*P and a portion of the mask buffer pattern 170_M and the gate capping layer 145 are removed, and the first source/drain contact 170 is formed. Then, the gate contact 180, the via plug 206, the second etch stop layer 197, the third interlayer insulating layer 192 and the wiring line 207 are formed.

In concluding the detailed description, those skilled in the art will appreciate that many variations and modifications may be made to the preferred embodiments without substantially departing from the principles of the present inventive concept. Therefore, the disclosed preferred embodiments of the disclosure are used in a generic and descriptive sense only and not for purposes of limitation.

What is claimed is:

1. A method of fabricating a semiconductor device, comprising:

forming a substrate having an active pattern therein;
forming a source/drain pattern on the active pattern;
forming a contact hole on the source/drain pattern;
forming a contact barrier layer in the contact hole, said contact barrier layer having an upper surface at a first height relative to a bottom surface of the contact hole;
forming a passivation layer on the contact barrier layer, in the contact hole;
forming a mask layer on the passivation layer, in the contact hole; then
removing an upper portion of the contact barrier layer so that an upper surface of the contact barrier layer has a second height lower than the first height;
selectively removing the passivation layer and the mask layer; and
forming a contact filling layer, which covers the upper surface of the contact barrier layer and fills the contact hole.

2. The method of claim 1, wherein said forming a passivation layer is preceded by forming a contact liner layer, which has an upper surface of a third height relative to the bottom surface of the contact hole, on the contact barrier layer;
wherein said forming a passivation layer includes oxidizing a surface of the contact liner layer; and
wherein an average grain size of the contact liner layer is smaller than an average grain size of the contact filling layer.

3. The method of claim 2, wherein said selectively removing the passivation layer and the mask layer is preceded by removing an upper portion of the contact liner layer so that an upper surface of the contact liner layer has a fourth height lower than the third height; and
wherein the contact filling layer covers the upper surface of the contact liner layer, which has the fourth height.

4. The method of claim 3, wherein the second height and the fourth height are equivalent relative to the bottom surface of the contact hole.

5. The method of claim 2, wherein the contact liner layer and the contact filling layer both include tungsten.

6. The method of claim 1, wherein the contact filling layer includes:

a first portion surrounded by the contact barrier layer of the second height, and
a second portion, which extends on the first portion and covers the upper surface of the contact barrier layer, the upper surface having the second height; and
wherein an average grain size of the first portion and an average grain size of the second portion are equivalent.

7. The method of claim 1, wherein said forming a mask layer includes:
forming an impurity layer on the passivation layer; and
forming the mask layer on the impurity layer; and
wherein said selectively removing the passivation layer and the mask layer includes removing the impurity layer.

8. The method of claim 7, wherein the impurity layer includes fluorine (F) and carbon (C).

9. The method of claim 1, wherein the second height is lower than a height of an upper surface of the mask layer.

10. The method of claim 1, wherein outer sidewalls of the contact filling layer and outer sidewalls of the contact barrier layer are aligned along the same plane.

11. The method of claim 1, wherein the contact barrier layer includes titanium; and wherein the contact filling layer includes tungsten.

12. A method of fabricating a semiconductor device, comprising:

forming an active pattern on a substrate;

forming a source/drain pattern on the active pattern;

forming a contact hole on the source/drain pattern;

forming a contact barrier layer, which covers entire sidewalls of the contact hole, in the contact hole;

forming a contact liner layer on the contact barrier layer, in the contact hole;

forming a passivation layer extended along the contact liner layer, in the contact hole;

forming a mask layer on the passivation layer, in the contact hole;

exposing a portion of the sidewalls of the contact hole by removing upper portions of the contact barrier layer and the contact liner layer;

removing the passivation layer and the mask layer; and forming a contact filling layer on the contact barrier layer and the contact liner layer, in the contact hole;

wherein the contact filling layer extends along a portion of the sidewalls of the contact hole.

13. The method of claim 12, wherein a thickness of the contact liner layer before the passivation layer is formed is greater than that of the contact liner layer after the passivation layer is formed.

14. The method of claim 12, wherein the passivation layer includes a film in which the contact liner layer is oxidized.

15. The method of claim 12, wherein an upper surface of the contact barrier layer and an upper surface of the contact liner layer, which are disposed below the contact filling layer, are disposed on the same plane.

16. The method of claim 12, wherein said removing the passivation layer and the mask layer includes wet-etching the passivation layer and the mask layer using ammonia water ($NH_4OH$).

17. The method of claim 12, wherein the contact filling layer is not in contact with sidewalls of the contact barrier layer.

18. The method of claim 12, wherein said removing upper portions of the contact barrier layer and the contact liner layer includes removing the upper portion of the contact barrier layer so that the contact barrier layer has a first upper surface, and removing the upper portion of the contact liner layer so that the contact liner layer has a second upper surface; and wherein the first upper surface and the second upper surface are disposed below an upper surface of the mask layer based on a bottom surface of the contact hole.

19. The method of claim 12, wherein said forming a mask layer includes:

forming an impurity layer, which extends along the passivation layer and includes fluorine and carbon, on the passivation layer; and forming the mask layer, which includes a spin-on hard mask (SOH), on the impurity layer; and wherein said removing the passivation layer and the mask layer includes removing the impurity layer.

20. A method of fabricating a semiconductor device, comprising:

forming an active pattern on a substrate;

forming a source/drain pattern on the active pattern;

forming a contact hole on the source/drain pattern;

forming a contact barrier layer, which has an upper surface at a first height relative to a bottom surface of the contact hole, in the contact hole;

forming a contact liner layer, which has an upper surface at a second height relative to the bottom surface of the contact hole, on the contact barrier layer;

forming a passivation layer on the contact liner layer by oxidizing an upper surface of the contact liner layer in the contact hole;

forming an impurity layer on the passivation layer in the contact hole;

forming a mask layer on the impurity layer;

removing an upper portion of the contact barrier layer so that an upper surface of the contact barrier layer has a third height lower than the first height;

removing an upper portion of the contact liner layer so that an upper surface of the contact liner layer has a fourth height lower than the second height; then removing the passivation layer, the impurity layer and the mask layer; and forming a contact filling layer, which covers the upper surface of the contact barrier layer of the third height and the upper surface of the contact liner layer of the fourth height and fills the contact hole, in the contact hole;

wherein the contact filling layer includes a first portion surrounded by the contact barrier layer and the contact liner layer, and a second portion disposed on the first portion and disposed on the upper surface of the contact barrier layer and the upper surface of the contact liner layer;

wherein the contact barrier layer includes titanium nitride;

wherein each of the contact liner layer and the contact filling layer includes tungsten;

wherein an average grain size of the contact liner layer is 10 nm or less; and wherein an average grain size of the first portion of the contact filling layer and an average grain size of the second portion of the contact filling layer are 10 nm or more.

* * * * *